(12) United States Patent
Lam et al.

(10) Patent No.: US 10,114,067 B2
(45) Date of Patent: *Oct. 30, 2018

(54) INTEGRATED WAVEGUIDE STRUCTURE AND SOCKET STRUCTURE FOR MILLIMETER WAVEBAND TESTING

(71) Applicant: Advantest Corporation, Tokyo (JP)

(72) Inventors: Daniel Lam, San Jose, CA (US); Don Lee, San Jose, CA (US); Roger McAleenan, San Jose, CA (US); Kosuke Miyao, San Jose, CA (US)

(73) Assignee: ADVANTEST CORPORATION, Tokyo (JP)

( * ) Notice: Subject to any disclaimer, the term of this patent is extended or adjusted under 35 U.S.C. 154(b) by 23 days.

This patent is subject to a terminal disclaimer.

(21) Appl. No.: 15/016,151

(22) Filed: Feb. 4, 2016

(65) Prior Publication Data

US 2017/0227598 A1  Aug. 10, 2017

(51) Int. Cl.
| | |
|---|---|
| *G01R 31/00* | (2006.01) |
| *G01R 31/28* | (2006.01) |
| *G01R 1/04* | (2006.01) |

(52) U.S. Cl.
CPC ....... *G01R 31/2834* (2013.01); *G01R 1/0441* (2013.01)

(58) Field of Classification Search
CPC .. H01P 5/107; H01P 3/06; H01P 5/087; H01P 5/12; H01P 1/045; H01P 3/121; H01P 3/165; H01P 5/00; H01P 5/184; H01P 1/042; H01P 3/026; H01P 3/123; H01P 3/127; H01P 5/08; H01P 5/188; G01N 21/64; G01N 21/6454; G01N 21/7743; G01N 21/7746; G01N 2201/02; G01N 2201/125; G01N 21/648; G01N 2021/6421; G06F 1/1683; G06F 15/18; G06F 19/3406; G06F 1/1658; G06F 21/73; G06F 21/76;

(Continued)

(56) References Cited

U.S. PATENT DOCUMENTS

| | | |
|---|---|---|
| 3,902,785 A | 9/1975 | Matthews |
| 3,995,238 A | 11/1976 | Knox et al. |

(Continued)

FOREIGN PATENT DOCUMENTS

| | | |
|---|---|---|
| CN | 201820177 | 5/2011 |
| EP | 1317684 | 6/2003 |

*Primary Examiner* — Vinh Nguyen

(57) ABSTRACT

A structure for signal transmission is disclosed. The structure comprises a first plurality of waveguides tightly disposed together and disposed substantially in parallel with each other, each of said waveguides having a first opening and a second opening, wherein each first opening is operable to align with a patch antenna, and wherein the first plurality of waveguides is disposed adjacent to a socket. The integrated structure further comprises the socket which comprises an opening operable to support an insertion of a device under test (DUT), wherein the DUT is communicatively coupled to a plurality of microstrip transmission lines on a printed circuit board (PCB) underlying the socket for transmitting test signals from the DUT, wherein each of the microstrip transmission lines is electrically coupled to a respective patch antenna. Further, the first plurality of waveguides and the socket are integrated into a single plastic or metal structure.

24 Claims, 21 Drawing Sheets

(58) Field of Classification Search
CPC ....... G06F 3/0484; H04W 4/003; H04W 4/02; H01R 12/716; H01R 13/6666; H01R 13/6683; H01R 24/64; H04M 1/0254; H04M 1/72575; H04M 1/185; G01R 1/045; G01R 1/24; G01R 31/2822; G01R 31/2889; G01R 33/4806; G01R 31/002; G01R 31/2834; G01R 31/3025; G01S 2007/027; H04Q 11/0005; H04Q 2011/0007

See application file for complete search history.

(56) References Cited

U.S. PATENT DOCUMENTS

| | | | |
|---|---|---|---|
| 4,564,260 A | 1/1986 | Dirmeyer et al. | |
| 4,848,866 A | 7/1989 | Feulner et al. | |
| 5,102,352 A | 4/1992 | Arisaka | |
| 5,181,025 A | 1/1993 | Ferguson et al. | |
| 5,708,296 A | 1/1998 | Bhansali | |
| 7,648,285 B2 | 1/2010 | Maletzky et al. | |
| 8,600,309 B2 | 12/2013 | Chang et al. | |
| 9,310,422 B2 | 4/2016 | Nath et al. | |
| 9,490,540 B1 | 11/2016 | Davies et al. | |
| 9,588,173 B2 * | 3/2017 | Isaac | G01R 31/2889 |
| 9,692,102 B2 | 6/2017 | Herbsommer et al. | |
| 2007/0154155 A1 | 7/2007 | Brist et al. | |
| 2008/0048639 A1 | 2/2008 | Sutono et al. | |
| 2009/0153158 A1 | 6/2009 | Dunn et al. | |
| 2011/0018657 A1 | 1/2011 | Cheng et al. | |
| 2012/0084968 A1 | 4/2012 | Nath et al. | |
| 2012/0268153 A1 | 10/2012 | Nickel et al. | |
| 2013/0016022 A1 | 1/2013 | Heiks et al. | |
| 2013/0200912 A1 | 8/2013 | Panagas | |
| 2013/0200915 A1 | 8/2013 | Panagas | |
| 2013/0200917 A1 | 8/2013 | Panagas | |
| 2014/0007674 A1 | 1/2014 | Weinzierle et al. | |
| 2014/0111239 A1 | 4/2014 | Blair et al. | |
| 2014/0285277 A1 * | 9/2014 | Herbsommer | H01P 3/16 333/1 |
| 2014/0312987 A1 | 10/2014 | Morita et al. | |
| 2016/0025788 A1 | 1/2016 | Fujita et al. | |
| 2016/0276996 A1 | 9/2016 | Tze-Meng et al. | |
| 2016/0356842 A1 | 12/2016 | Lee | |
| 2017/0102409 A1 | 4/2017 | Sarhad et al. | |
| 2017/0227598 A1 | 8/2017 | Lam et al. | |
| 2017/0229754 A1 * | 8/2017 | Lee | H01P 5/188 |
| 2017/0279491 A1 | 9/2017 | Lam | |

\* cited by examiner

300

301
A plurality of patch antennas are electrically coupled to a socket of a DUT interface to store a device for testing. Each patch antenna is proximately positioned relative to each other and the socket.

302
A plurality of waveguides are mounted on to a respective patch antenna from the plurality of patch antennas. Each waveguide is adapted to allow signal traversal from the device under test to a tester diagnostic system.

303
Test signals are generated for the device under test by a tester diagnostic system. The test signals can traverse a signal path that includes the socket, at least one patch antenna of the plurality of patch antennas, and at least one waveguide of the plurality of waveguides.

304
Upon traversal of the signal path, the test signals are received by a tester diagnostic system, where they can be further processed.

401
An incision is made along an outer portion of a waveguide. The incision can be made down the middle of a waveguide along its longitudinal axis thereby dividing the waveguide into two portions and exposing both the outer and inner surfaces of each portion of the divided waveguide. The incision forms a trench structure having a width that extends from the location of the incision point to an early apex area of the curved channel inner wall of the waveguide

402
The inner surfaces of each portion of the divided waveguide are plated.

403
The divided portions of the waveguide are secured together to restore the waveguide to its original structure prior to the incision procedure performed during step 401.

FIG. 6

INTEGRATED WAVEGUIDE STRUCTURE AND SOCKET STRUCTURE FOR MILLIMETER WAVEBAND TESTING

CROSS-REFERENCE TO RELATED APPLICATIONS

This application is related to U.S. patent application Ser. No. 15/016,124 filed Feb. 4, 2016, entitled, "WAVE INTERFACE ASSEMBLY FOR AUTOMATIC TEST EQUIPMENT FOR SEMICONDUCTOR TESTING," which is herein incorporated by reference in its entirety. This application is also related to U.S. patent application Ser. No. 15/016,143 filed Feb. 4, 2016 entitled, "PLATING METHODS FOR MODULE AND/OR GANGED WAVEGUIDES FOR AUTOMATIC TEST EQUIPMENT FOR SEMICONDUCTOR TESTING,", which is herein incorporated by reference in its entirety. This application is also related to U.S. patent application Ser. No. 15/016,133 filed Feb. 4, 2016 entitled, "MULTIPLE WAVEGUIDE STRUCTURE WITH SINGLE FLANGE FOR AUTOMATIC TEST EQUIPMENT FOR SEMICONDUCTOR TESTING," which is herein incorporated by reference in its entirety.

FIELD OF THE INVENTION

Embodiments of the present disclosure generally relate to Automatic Test Equipment (ATE) for testing electronic components.

BACKGROUND

Automatic Test Equipment (ATE) is commonly used within the field of electronic chip manufacturing for the purposes of testing electronic components. ATE systems both reduce the amount of time spent on testing devices to ensure that the device functions as designed and serve as a diagnostic tool to determine the presence of faulty components within a given device before it reaches the consumer.

ATE systems can perform a number of test functions on a device under test (DUT) through the use of test signals transmitted to and from the DUT. Conventional ATE systems are very complex electronic systems and generally include printed circuit boards (PCB), coax cables and waveguides to extend the signal path of test signals transmitted from the DUT to a tester diagnostic system during a test session. However, increases to the length of the signal path, particularly at millimeter frequencies, can result in the loss of signal strength which can degrade the integrity of test signals transmitted from the DUT at high frequencies.

Conventional ATE systems use PCBs that include several centimeters of microstrip transmission lines disposed on the surface of a PCB to convey test signals from a DUT to a tester diagnostic system. Furthermore, when waveguides are used in conventional ATE systems requiring high frequency signaling, and conventional waveguide flanges are used to mate the waveguide and tester electronics to the DUT, the general dimensions of these flanges, which are often circular in shape, can be a limiting factor to the total signal path of test signals. Accordingly, the elongation of the test signal path caused by use of longer microstrip transmission lines as well as other components, such as coax cables and conventional waveguide flanges (including any adaptors required by these components) by modern ATE systems can result in unnecessary signal loss at high frequencies.

Furthermore, the large size of the waveguide flanges means that they cannot be closely mounted together with adjacent waveguides when multiple signal paths need to converge on an integrated circuit with tightly aligned signal paths. Additionally, signal loss can occur over the long microstrip traces from the device pads of the socket (carrying the DUT) to the waveguide flanges used to mate the waveguide and tester electronics to the DUT.

SUMMARY OF THE INVENTION

Accordingly, a need exists for an apparatus and/or method that can address the problems with the approaches described above. Using the beneficial aspects of the apparatus and/or method described, without their respective limitations, embodiments of the present disclosure provide a novel solution to address these problems.

Embodiments of the present disclosure use customizable waveguides that can be positioned next to each other in a structure that contains one single flange to provide a physical connection for the waveguides. In this fashion, many waveguides can be positioned within a small area to accommodate a tightly packed patch antenna array so that the waveguides can be positioned very close to the socket. As such, embodiments of the present disclosure allow more waveguides to be packed into a small area by providing a single structure that houses many waveguides and share only a single flange connection element that can be sized appropriately.

More specifically, in one embodiment, the present invention is implemented as an integrated structure for signal transmission. The integrated structure includes a plurality of waveguides tightly disposed together and disposed substantially in parallel with each other, each of the waveguides having a first opening and a second opening.

Further, in one embodiment, the integrated structure (comprising a plurality of waveguides) can itself be integrated with the socket holding the DUT to reduce the microstrip traces from the patch antennas in the waveguides ports to the device pads in the socket. In other words, by integrating the waveguide structure and the socket holding the DUT, the microstrip traces between the device pads in the socket and the rectangular waveguide ports (for the integrated waveguide structure) can be reduced. By bringing the devices closer and reducing the trace lengths signal-loss can be advantageously reduced especially at the high microwave frequencies.

In one embodiment, the plurality of waveguides are integrated within a single plastic structure. In one embodiment, the plurality of waveguides are separate waveguide structures held together via mounting mechanisms. In one embodiment, the plurality of waveguides are integrated within a single metal structure.

The integrated structure also includes a single flange connected to the plurality of waveguides at the first openings, the single flange operable for securing the plurality of waveguides to a printed circuit board (PCB) including a plurality of patch antennae, and where a pitch of the first openings is operable to align with a pitch of the patch antennae, where the single flange includes a plurality of mounting mechanisms for securing the single flange to the PCB. In a different embodiment, however, the integrated waveguide structure is integrated with the socket, wherein a flange is no longer required at the first openings to connect the integrated structure to the PCB because the socket and the waveguide structure are integrated into a single structure. However, other fastening agents e.g. screws, etc. may be required to connect the singular integrated socket and waveguide structure to the underlying PCB.

In one embodiment, the plurality of waveguides are integrated within a single plastic structure and where inner portions of the plastic structure are metal plated. In one embodiment, the plurality of waveguides are curved in shape. In one embodiment, the single plastic structure is mounted to the PCB using a fastening agent.

BRIEF DESCRIPTION OF THE DRAWINGS

The accompanying drawings, which are incorporated in and form a part of this specification and in which like numerals depict like elements, illustrate embodiments of the present disclosure and, together with the description, serve to explain the principles of the disclosure.

FIG. 5 is a flowchart of an exemplary assembly of a wave interface for testing a device in accordance with embodiments of the present disclosure.

FIG. 6 is a flowchart of an exemplary plating process for modular and/or ganged waveguides used by a wave interface assembly in accordance with embodiments of the present disclosure.

DETAILED DESCRIPTION

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Figure 1A:
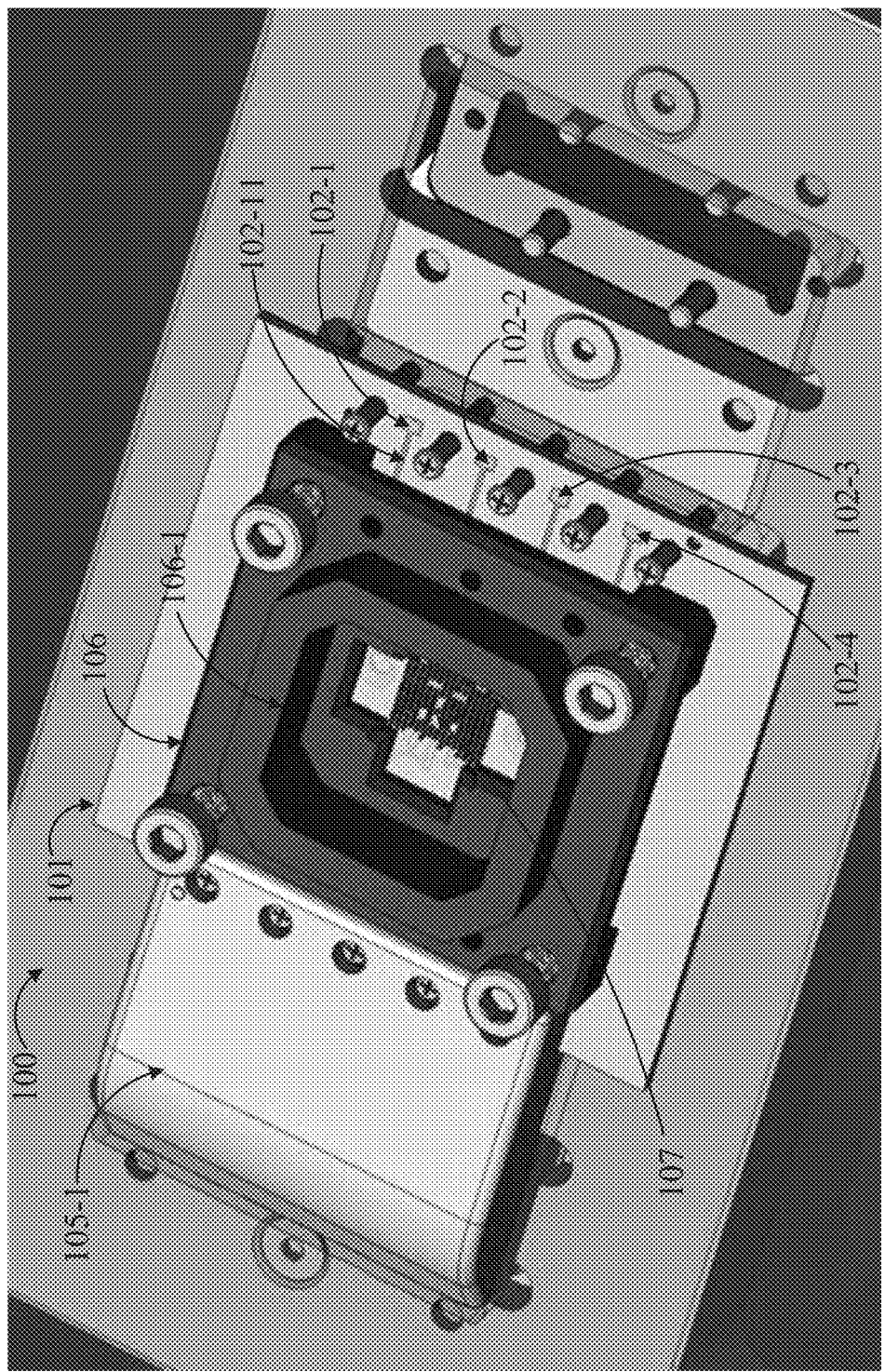
FIG. 1A is a perspective view of an exemplary wave interface assembly in accordance with embodiments of the present disclosure.

FIG. 1A is a perspective view of an exemplary wave interface assembly in accordance with embodiments of the present disclosure. Wave interface assembly 100 may be implemented within any testing system capable of testing multiple electronic components individually or in parallel. According to one embodiment, wave interface assembly 100 can be utilized in auto-radar detection applications, systems or similar implementations as well as in devices capable of performing operations using microwave frequencies generally ranging from 50 to 110 GHz (e.g., auto radar operations performed at approximately 94 GHz).

Wave interface assembly 100 includes device under test (DUT) interface 106. As illustrated by the embodiment depicted in FIG. 1A, DUT interface 106 may include holes or apertures for purposes of using fastening agents (e.g., screws) to couple DUT interface 106 to a side of a printed circuit board (PCB), such as PCB 101. DUT interface 106 includes socket 106-1. In one embodiment, socket 106-1 may include recessed portions and/or grooves of sufficient dimensions to support the placement of a DUT (e.g., devices capable of generating and/or receiving radar signals, etc.) within DUT interface 106 during a testing session.

As illustrated in FIG. 1A, socket 106-1 may include a first opening adapted to support the insertion of a device (e.g., transceivers, etc.) within DUT interface 106. Socket 106-1 may also include a second opening adapted to mount the device placed within DUT interface 106 on to a ball grid array, such as BGA 107. BGA 107 can be packaged as a set of interconnection balls or pins positioned on a side of PCB 101 for coupling to a device. As such, BGA 107 can be used for coupling a tester diagnostic system to a set of test points on a DUT installed within socket 106-1.

PCB 101 can include one or more microstrip transmission lines (not pictured) for conveying signals of varying frequencies across PCB 101. PCB 101 can be adapted to include circuitry capable of propagating signals received from a DUT in a manner that requires shorter microstrip lengths. According to one embodiment, wave interface assembly 100 can include balun circuitry adapted to convert differential signals into a single ended output signal for receipt by a tester diagnostic system. According to one embodiment, wave interface assembly 100 can include differential DUT pads and/or single-ended patch antenna ports. As such, PCB 101 can include electrical components with low profiles that are capable of being mounted on a flat surface.

For instance, with further reference to the embodiment depicted in FIG. 1A, PCB 101 can include one or more patch antennas capable of propagating signals at varying gain levels. As such, a set of different patch antennas (e.g., patch antennas 102-1, 102-2, 102-3, 102-4) can be adapted to electrically couple to microstrip transmission lines formed on PCB 101 to convey test signals received from a DUT to a tester diagnostic system or a different location point. Furthermore, the patch antennas may be used to generate differential signals to amplify test signals transmitted from a DUT. Differential signals can then be converted into a single ended output signal using a transformer device.

According to one embodiment, patch antennas 102-1, 102-2, 102-3, and/or 102-4 can be coupled to balun circuitry installed beneath DUT interface 106. For instance, in one embodiment, patch antennas 102-1, 102-2, 102-3, and/or 102-4 can include single-ended patch antenna ports coupled to differential DUT pads through differential transformers. In this fashion, patch antennas 102-1, 102-2, 102-3, and/or 102-4 can be configured to convert differential signals into a single ended output signal for receipt by a tester diagnostic system.

As described herein, the profile and/or pitch (e.g., a minimum separation) of patch antennas enables a greater number of them to be installed within wave interface assembly 100. Moreover, their profiles and/or pitches also enable them to be arranged in various patterns and configurations within wave interface assembly 100 based on a pre-determined wave interface and/or waveguide system scheme. As such, the ease in which patch antennas can be arranged within wave interface assembly 100 allows them to be installed in a manner that requires shorter microstrip lengths and/or places them closer to the DUT.

With further reference to the embodiment depicted in FIG. 1A, the general shape of patch antennas 102-1, 102-2, 102-3, and/or 102-4 allow them to be proximately placed relative to each other in a manner that creates high density port spacing at PCB 101. Also, as illustrated by the embodiment depicted in FIG. 1A, patch antennas can be positioned in a series and/or parallel to each other. Furthermore, as illustrated by the embodiment depicted in FIG. 1A, patch antennas 102-1, 102-2, 102-3, and/or 102-4 can be placed along or in proximity to an edge surface of PCB 101. Accordingly, the arrangement of patch antennas 102-1, 102-2, 102-3, and/or 102-4 within wave interface assembly 100 allows them to be installed in a manner that requires shorter microstrip lengths and/or places them closer to DUT interface 106. Thus, this arrangement can minimize the potential degradation of signals received from a DUT installed within DUT interface 106.

Furthermore, each patch antenna can be coupled to a respective waveguide associated with a waveguide system. As will be described infra, waveguides used by wave interface assembly 100 may include customizable waveguides that can vary in dimensions. As such, each waveguide installed within wave interface assembly 100 can be mounted on to a respective patch antenna installed within wave interface assembly 100. In this fashion, waveguides installed within wave interface assembly 100 can be fabricated in a manner that allows them to be tightly fitted to patch antennas installed within wave interface assembly 100, thereby creating a tighter pitch between waveguides and the device under test.

Moreover, waveguides installed within wave interface assembly 100 can be positioned next to each into a single structure in a manner that allows a single flange to become a physical connection element to multiple waveguides. The single structure allows multiple waveguides to be positioned within a small area to accommodate a high density, tightly packed array of patch antennas, thereby allowing the waveguides to be positioned very close to DUT interface 106.

Figure 1B:
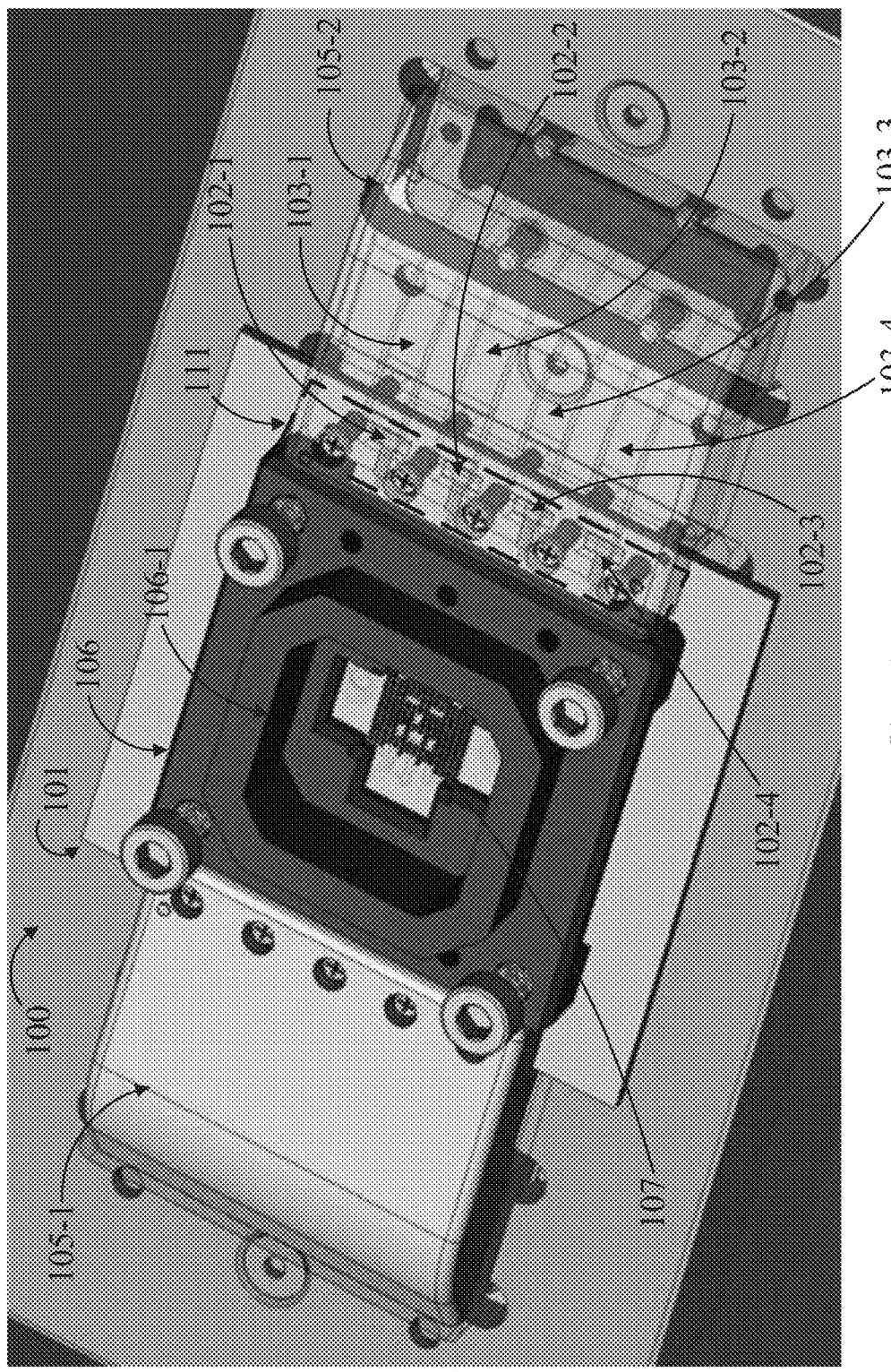
FIG. 1B is another perspective view of an exemplary wave interface assembly in accordance with embodiments of the present disclosure.
Figure 1C:
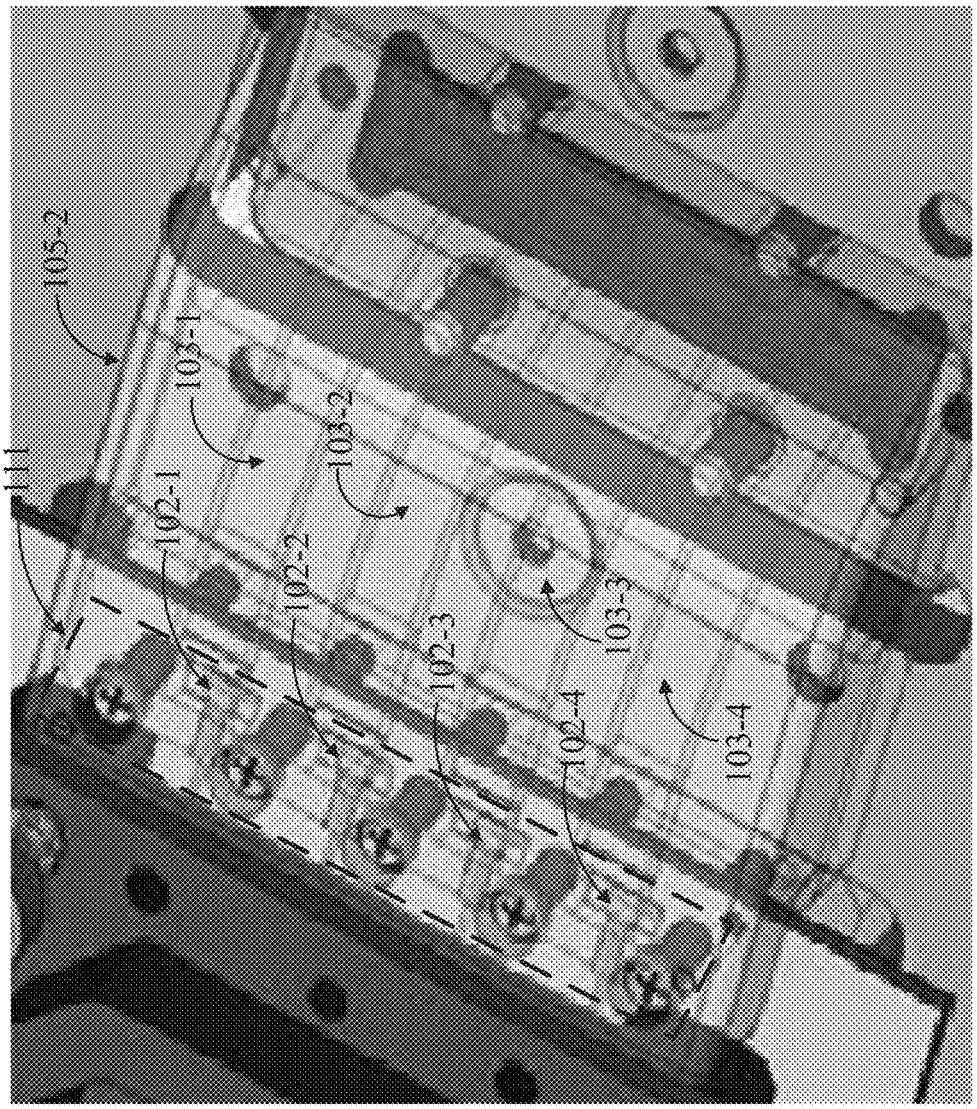
FIG. 1C is yet another perspective view of an exemplary wave interface assembly in accordance with embodiments of the present disclosure.
Figure 1D:
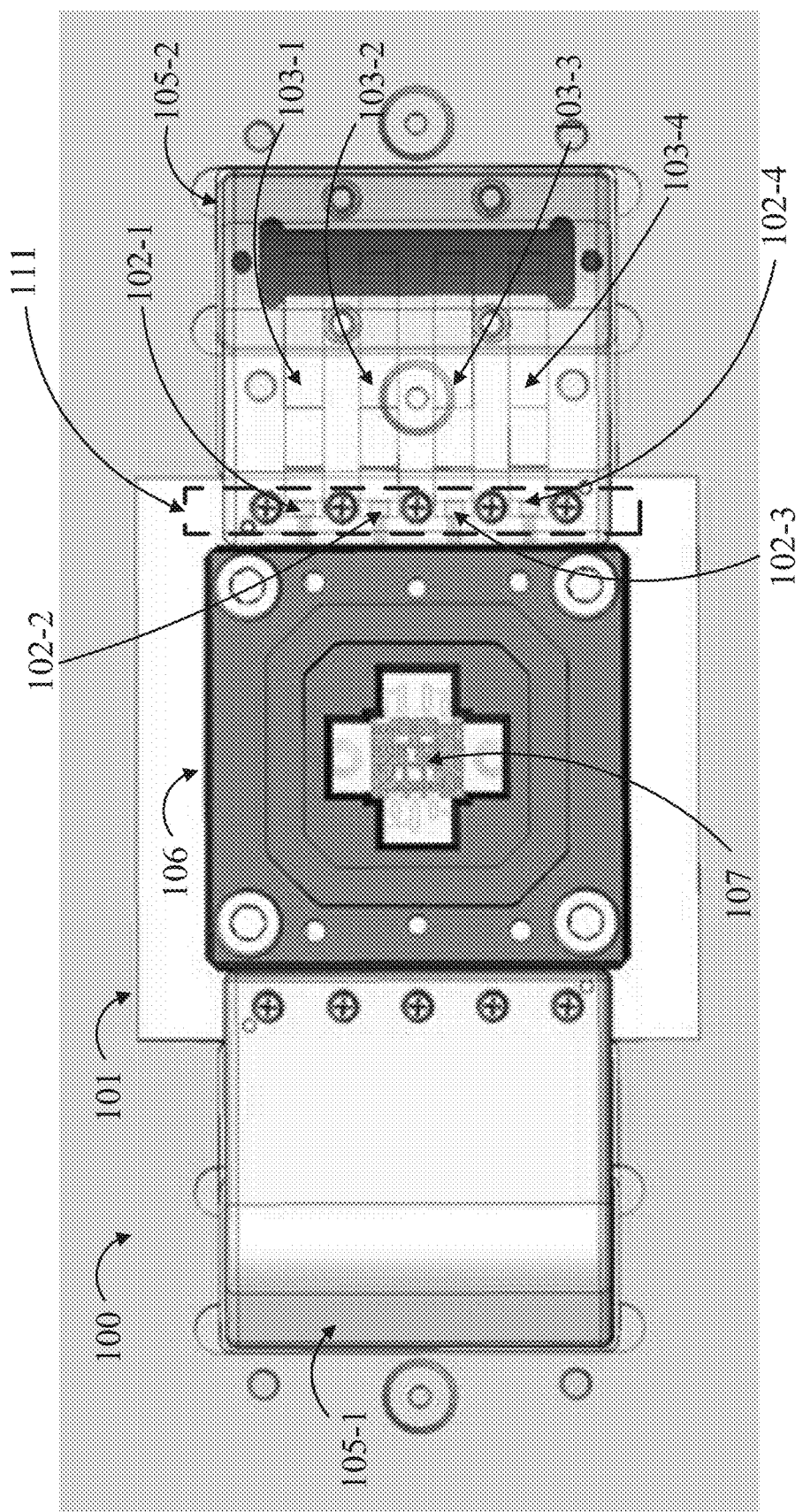
FIG. 1D is a plan view of an exemplary wave interface assembly in accordance with embodiments of the present disclosure.

For example, with reference to the embodiments depicted in FIGS. 1B, 1C and 1D, wave interface assembly 100 can include a covering structure (e.g., covering structure 105-1, covering structure 105-2) containing a set of different waveguides, such as waveguides 103-1, 103-2, 103-3, and/or 103-4. As illustrated in FIGS. 1B, 1C and 1D, waveguides 103-1, 103-2, 103-3, and/or 103-4 may be a set of parallel waveguides integrated within wave interface assembly 100 in a manner that allows flange 111 to become a physical connection element to multiple waveguides. In this fashion, flange 111 includes different waveguides that can each be used as separate, independent transmit channels that are each capable of providing separate tester resources to a DUT during a testing session. According to one embodiment, these channels can be used to transmit test signals between a DUT installed within socket 106-1 and a tester diagnostic system.

As will be discussed in detail below in relation to FIGS. 2A, 2B, 2C and 2D, in one embodiment, the covering structures (e.g., covering structure 105-1, covering structure 105-2) comprising their respective waveguides (e.g. 103-1, 103-2, 103-3, and/or 103-4) and the socket 106-1 may all be combined together in one structure so as to reduce the microstrip traces, e.g., 102-11 from the patch antennas (e.g. 102-1, 102-2, 102-3, and/or 102-4) interfacing with the waveguide ports to the device pads in the socket 106-1. In one embodiment, if the integrated single waveguide structures are combined with the socket 106-1, then flanges, e.g. 111 may no longer be required to secure the ganged waveguide structure to the PCB 101. By eliminating the flanges, the microstrip traces between the patch antennas (corresponding to the waveguide ports) on one end and the device pads in the socket on the other end can be advantageously reduced, thereby, reducing signal loss and increasing signal strength and integrity. The combined socket and waveguide structure can, in this embodiment, be fastened to the PCB board 101 in other ways, e.g. using screws or other fastening agents.

As depicted in FIGS. 1B, 1C and 1D, waveguides 103-1, 103-2, 103-3, and/or 103-4 can each be integrated within wave interface assembly 100 in a manner that allows them to be physically coupled to patch antennas 102-1, 102-2, 102-3, and/or 102-4 installed within wave interface assembly 100 sharing a common flange 111. As such, waveguides 103-1, 103-2, 103-3, and/or 103-4 can be fabricated in a manner that allows them to propagate signals transmitted from a DUT installed within DUT interface 106 to a tester diagnostic system or a different system. In this fashion, waveguides 103-1, 103-2, 103-3, and/or 103-4 can each be installed within wave interface assembly 100 can be sufficiently mounted on patch antennas 102-1, 102-2, 102-3, and/or 102-4, respectively. Furthermore, as illustrated by the embodiments depicted in FIGS. 1B, 1C and 1D, waveguides 103-1, 103-2, 103-3, and/or 103-4 can be placed along or in proximity to an edge surface of PCB 101. In this fashion, waveguides 103-1, 103-2, 103-3, and/or 103-4 can be a tightly coupled waveguide assembly using a common flange 111 that eliminates the disadvantages normally attributed to conventional, individual waveguide flanges. In one embodiment the pitch between waveguides 103-1, 103-2, 103-3, and/or 103-4 and DUT interface 106 may be uniform. In one embodiment the pitch between waveguides 103-1, 103-2, 103-3, and/or 103-4 may be uniform.

As described herein, waveguides 103-1, 103-2, 103-3, and/or 103-4 can be adapted to conform to the profile and/or pitch of patch antennas 102-1, 102-2, 102-3, and/or 102-4. For instance, waveguides 103-1, 103-2, 103-3, and/or 103-4 used by wave interface assembly 100 can include port openings that are adapted to allow waveguides 103-1, 103-2, 103-3, and/or 103-4 to be mounted on to the profiles of patch antennas 102-1, 102-2, 102-3, and/or 102-4, respectively.

In this manner, integrated waveguides 103-1, 103-2, 103-3, and/or 103-4 can each be fabricated to conform to the dimensions and/or pitch of patch antennas 102-1, 102-2, 102-3, and/or 102-4. Thus, the coupling of waveguides to patch antennas in this manner produces a plurality of miniaturized waveguide flanges that can be customizable based on the dimensions of a desirable ATE system or scheme. Accordingly, the increased number of patch antenna elements can correspondingly increase the number of waveguides that can be used by ATE when testing a device and allow high density waveguide placement.

Furthermore, the ability to install waveguides 103-1, 103-2, 103-3, and/or 103-4 in the manner depicted by the embodiments illustrated in FIGS. 1B, 1C and 1D enables them to be placed in a position in close proximity to DUT interface 106 and/or socket 106-1 such that the length of microstrip transmission lines formed on PCB 101 are minimized or shortened. For instance, the length and/or width dimensions of microstrip transmission lines formed or disposed on PCB 101 can be shortened due to the tight pitch between waveguides 103-1, 103-2, 103-3, and/or 103-4 and DUT interface 106 and/or socket 106-1. Thus, the positioning of waveguides 103-1, 103-2, 103-3, and/or 103-4 in the manner depicted in FIGS. 1B, 1C and 1D can minimize total signal path loss as well as signal degradation. Also, as will be discussed in detail below in relation to FIGS. 2A, 2B, 2C and 2D, in one embodiment, the length of the microstrip transmission lines can be reduced even further by combining the waveguide structures (e.g, the waveguide structure comprising waveguides 103-1, 103-2, 103-3, and/or 103-4) with the socket 106-1. By eliminating the flanges in between, e.g. flange 111, and combining the structures, the pitch between the device pads in the socket and the patch antennas corresponding to the waveguide ports can be tightened even further.

Figure 1E:
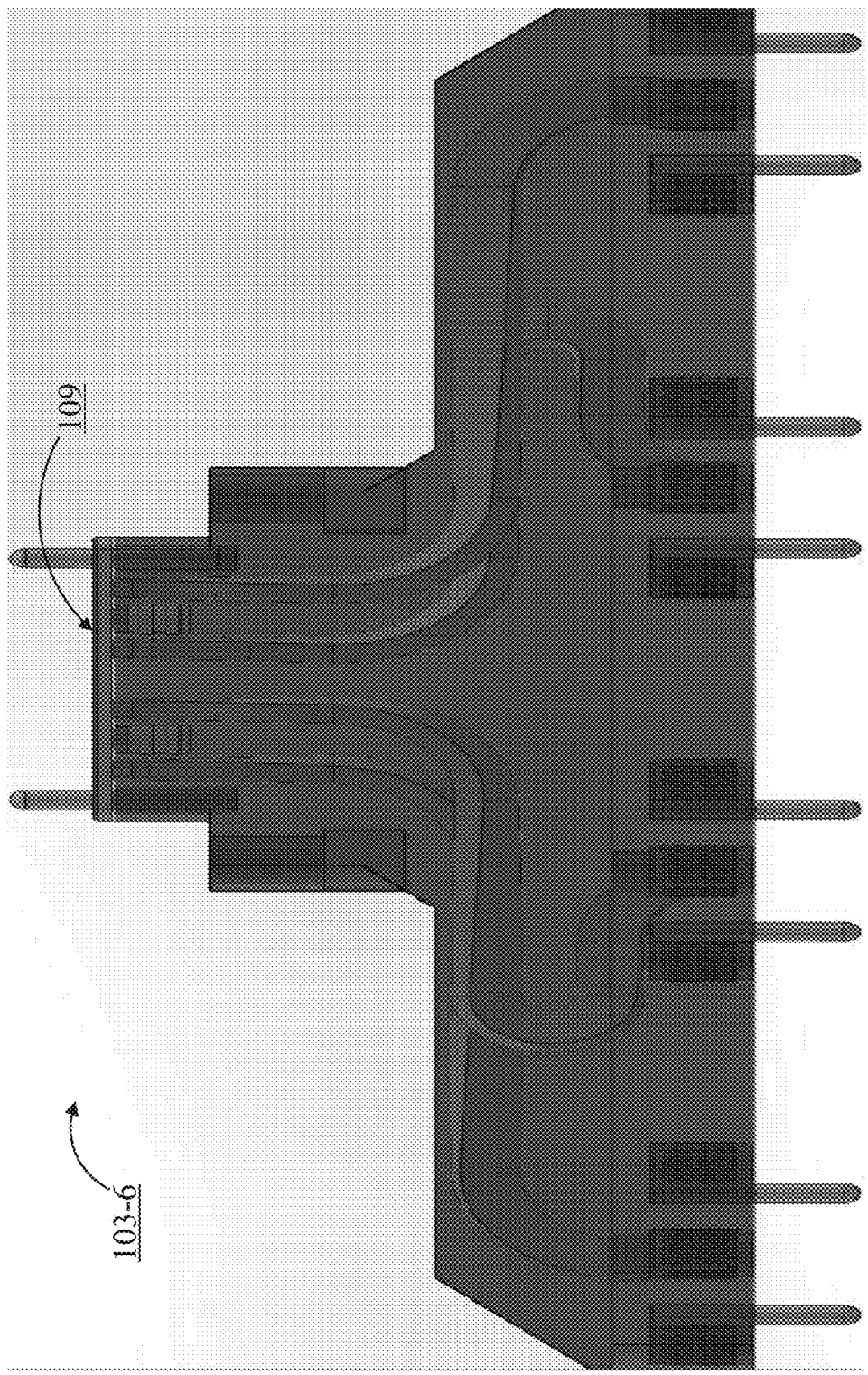
FIG. 1E depicts an exemplary waveguide used by a wave interface assembly in accordance with embodiments of the present disclosure.

Furthermore, in one embodiment, waveguides 103-1, 103-2, 103-3, 103-4 may be adapted or configured to be coupled to a different set of wave guides. In this fashion, a plurality of different wave guides comprising of different materials, such as metal, plastic, etc., can be coupled to each other thereby extending a particular system of waveguides used for a testing session. Also, although the sides of waveguides depicted in FIGS. 1A, 1B, 1C and 1D appear to have uniform dimensions, embodiments of the present disclosure are not limited as such. For instance, with reference to the embodiment depicted in FIG. 1E, waveguide 103-6 may be fabricated in a manner such that the side dimensions of the waveguide are configured to expand or "fan out" in a direction that is away from the location of the high density, tightly packed array of patch antennas (see, e.g., location 109 in FIG. 1E which depicts the location of patch antennas 102-1, 102-2, 102-3, and/or 102-4). According to one embodiment, the one end of a waveguide can be fabricated to be of a dimension that is different from an opposite end. For instance, the end of waveguide 103-1 that is mounted to patch antenna 102-1 can be fabricated to be of different dimensions (e.g., narrower) that the opposite end of waveguide 103-1 (e.g., broader).

With further reference to the embodiments depicted in FIGS. 1A, 1B, 1C and 1D, structures used by wave interface assembly 100 to house waveguide systems, such as covering structures 105-1 and/or 105-2, may be fabricated to include a single exterior layer or multiple layers. According to one embodiment, the exterior layers of covering structures 105-1 and/or 105-2 may comprise material (e.g., plastic, metal, or similar materials, etc.) suitable for propagating signals through waveguide systems described herein. In some embodiments, the inner portions of covering structures 105-1 and/or 105-2 may include materials such as plastic and/or metal. The covering structures 105-1 and/or 105-2 may include holes or apertures for purposes of using fastening agents (e.g., screws) to couple to one side of a PCB. Covering structures 105-1 and/or 105-2 may also include alignment pins which can be used to mate to a set of waveguides located on an opposite side of the PCB.

Figure 1F:
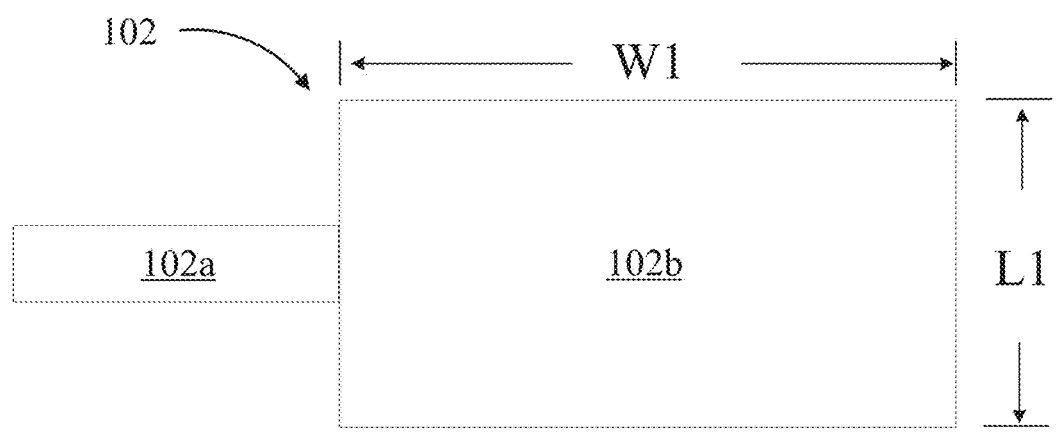
FIG. 1F is a block diagram depicting an exemplary patch antenna used by a wave interface assembly in accordance with embodiments of the present disclosure.

FIG. 1F is a block diagram depicting an exemplary patch antenna used by a wave interface assembly in accordance with embodiments of the present disclosure. Patch antennas may be used to providing a mating interface to multiple waveguides used by a wave interface assembly in accordance with embodiments of the present disclosure. As such, the size of a patch antenna can be customized to act as a physical connection point for multiple waveguides.

For instance, patch antenna 102 may have a low profile and characteristics that enable patch antenna 102 to be mounted on a flat surface, such as PCB 101. For instance, as depicted in FIG. 1F, patch antenna 102 may include a conductive microstrip transmission line, such as microstrip transmission line 102a, which may be disposed on a top surface of PCB 101. Microstrip transmission lines can include at least one thin conducting strip ("trace") capable of being separated from a ground plane conductor by a dielectric layer or substrate.

Microstrip transmission lines can be fabricated using conventional etching techniques that include photolithography or other forms of printed circuit board fabrication technology. As such, microstrip transmission lines can be fabricated with varying degrees of height, width, and/or dielectric constant values. Additionally, patch antenna 102 can include a conductive radiator patch 102b having dimensions length L1 and width W1 and may be rectangular in shape. In this fashion, embodiments of the present disclosure may use the profile, pitch and/or conductive properties of patch antenna 102 to extend the bandwidth of test signals transmitted from a DUT to another point or location, such as a tester diagnostic system.

Figure 1G:
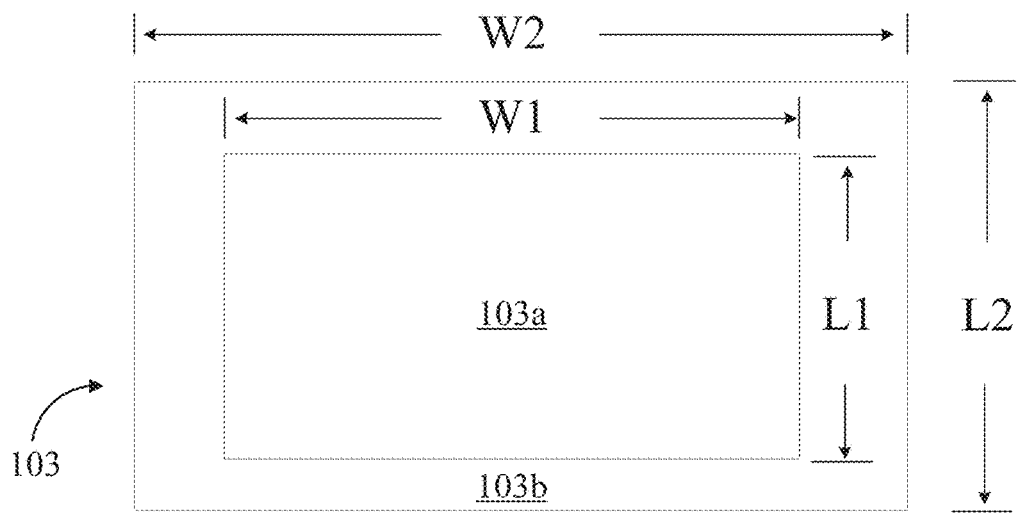
FIG. 1G is a block diagram depicting a cross-section view of a waveguide used by a wave interface assembly in accordance with embodiments of the present disclosure.

FIG. 1G depicts a cross-section view of one end of an exemplary waveguide structure in accordance with embodiments of the present disclosure. The embodiment depicted in FIG. 1G depicts an exemplary mating interface of a waveguide that can be used by a wave interface assembly in accordance with embodiments of the present disclosure. In one embodiment, waveguide 103 may be a WR12 waveguide or a suitable waveguide for the band required. Waveguide 103 may be customized in a manner that allows wave interface assembly 100 to utilize shorter microstrip transmission lines to propagate test signals transmitted from a DUT to a termination point, such as a tester diagnostic system. According to one embodiment, waveguide 103, or portions thereof (e.g., mating interface frame) can be fabricated using 3 dimensional (3D) printing technologies.

For instance, waveguide cross-section 103 may be fabricated to include generally flat interface portions, e.g., mating interface frame 103b, which may be located on the ends of waveguide 103. As depicted in FIG. 1G, mating interface frame 103b can be fabricated to have dimensions length L2 and width W2 and may be rectangular in shape. Portions of mating interface frame 103b may include port openings, e.g., port opening 103a, that can be fabricated to have dimensions length L1 and width W1 and may be rectangular in shape. Port opening 103a may be an entry or exiting point of waveguide 103 for signals traversing through waveguide 103. As such, in one embodiment, when mating interface frame 103b of waveguide 103 is placed in a flushed position against a similar mating interface frame of a different waveguide, each waveguide's respective port opening may be aligned in manner that allows for the traversal of signals between the two waveguides.

In this fashion, a port opening, such as port opening 103a, can be coupled to other electrical components, such as patch antenna 102, to extend the signal path of signals transmitted from a DUT and through a waveguide system. According to one embodiment, waveguide 103 may comprise metal, plastic or similar materials capable of minimizing signal degradation. According to one embodiment, waveguide 103 may include plated portions which are adapted to prevent signal degradation.

Figure 1H:
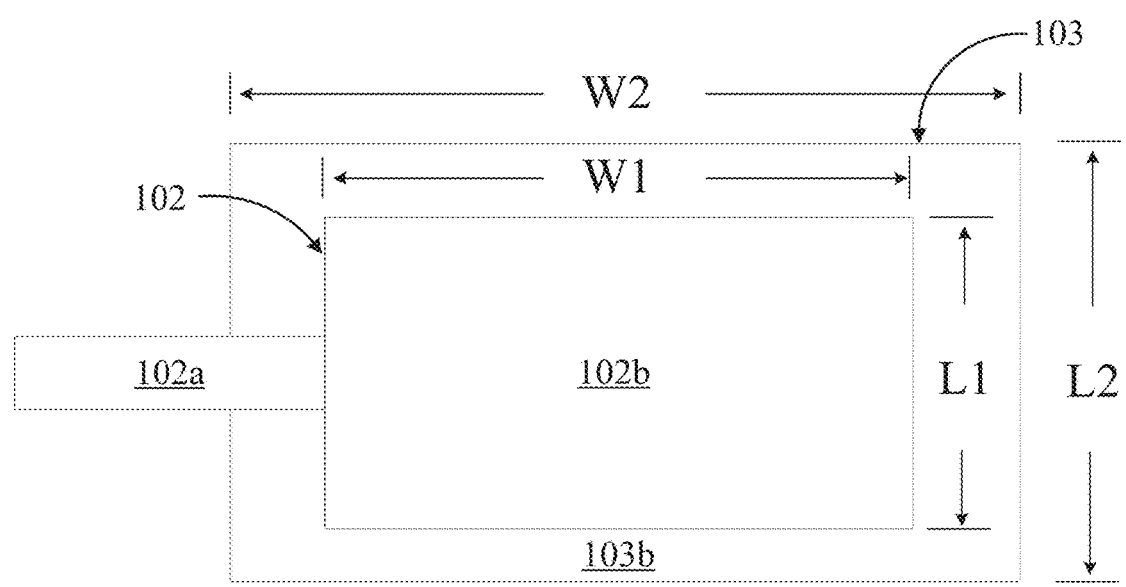
FIG. 1H is a block diagram depicting an exemplary mounting of a waveguide on to a patch antenna used by a wave interface assembly in accordance with embodiments of the present disclosure.

FIG. 1H is a block diagram depicting an exemplary mounting of a waveguide cross-section on to a patch antenna used by a wave interface assembly in accordance with embodiments of the present disclosure. As depicted in FIG. 1H, the dimensions of portions of a waveguide mating interface (e.g., port opening 103a and/or radiator patch 102b) can be fabricated or adapted in a manner that allows waveguide 103 to be sufficiently mounted on to patch antenna 102. According to one embodiment, the dimensions (e.g., L1 and/or W1) of port opening 103a (depicted as beneath radiator patch 102b) may be similar to that of radiator patch 102b such that when aligning the two objects together and placing them in a flushed position against each other, the potential for signal loss between patch antenna 102 and waveguide 103 can be minimized.

According to one embodiment, and with further reference to the embodiments depicted in FIGS. 1G and 1H, the dimensions (e.g., L2 and/or W2) of mating interface frame 103b may be equivalent or slightly larger than the dimensions of radiator patch 102b and/or port opening 103a such that the potential for signal loss between patch antenna 102 and waveguide 103 can be minimized when patch antenna 102 and waveguide 103 are coupled to each other. As such, the dimensions of mating interface frame 103b may be such that it allows waveguide 103 to be installed within wave interface assembly 100 in a manner that requires shorter microstrip lengths and/or places waveguides in positions that are closer to the location of DUT during a testing session.

Embodiments of the present disclosure also include waveguide surface reinforcement procedures and/or plating procedures for modular and/or ganged waveguides used by a wave interface assembly. Embodiments of the present disclosure include waveguides that can be divided in a manner such that the inner portions and/or outer portions of the waveguide can be plated. Plating procedures may include applying a layer of material (e.g., silver, copper, etc.) to the inner portions and/or outer portions of the waveguide. FIGS. 1I, 1J, 1K and 1L depict cross-sectional views of plated waveguides produced through a plating process for modular and/or ganged waveguides used by a wave interface assembly in accordance with embodiments of the present disclosure. Although FIGS. 1I, 1J, 1K and 1L depict waveguides having a generally curved body, embodiments of the present disclosure are not limited to such configurations.

Figure 1I:
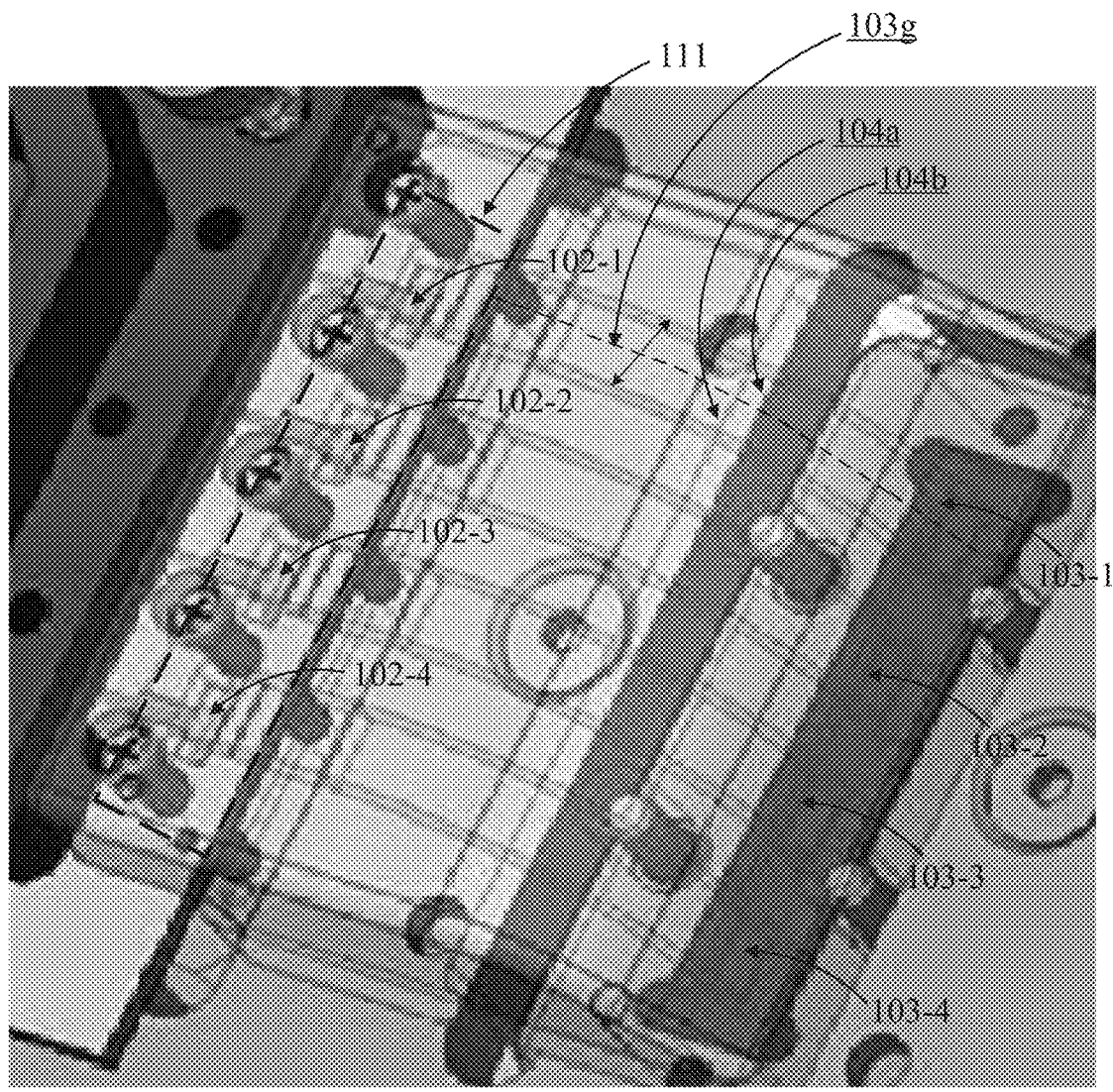
FIG. 1I is a cross-sectional view of a waveguide undergoing an exemplary plating process for modular and/or ganged waveguides used by a wave interface assembly in accordance with embodiments of the present disclosure.
Figure 1J:
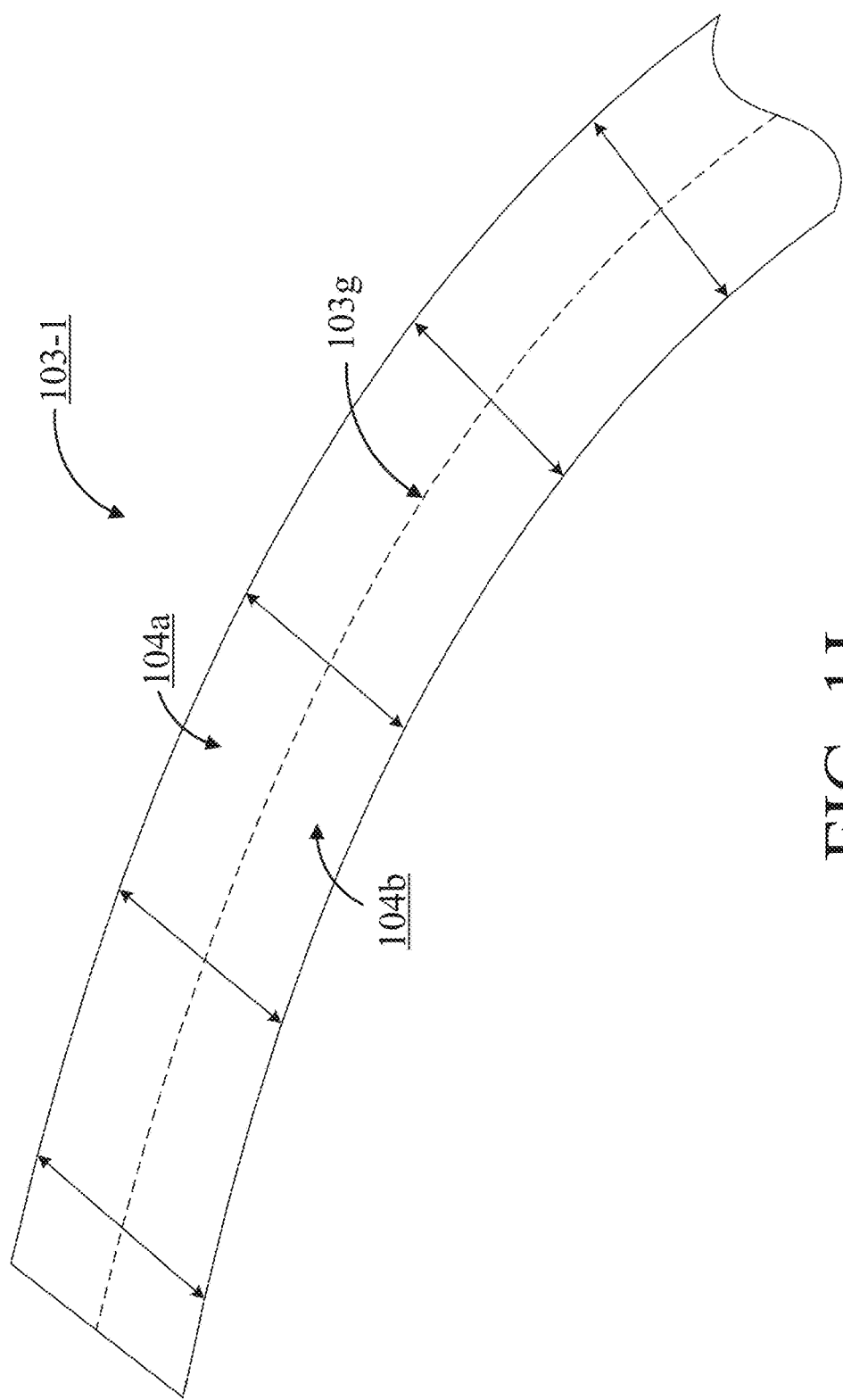
FIG. 1J is another cross-sectional view of a waveguide undergoing an exemplary plating process for modular and/or ganged waveguides used by a wave interface assembly in accordance with embodiments of the present disclosure.
Figure 1K:
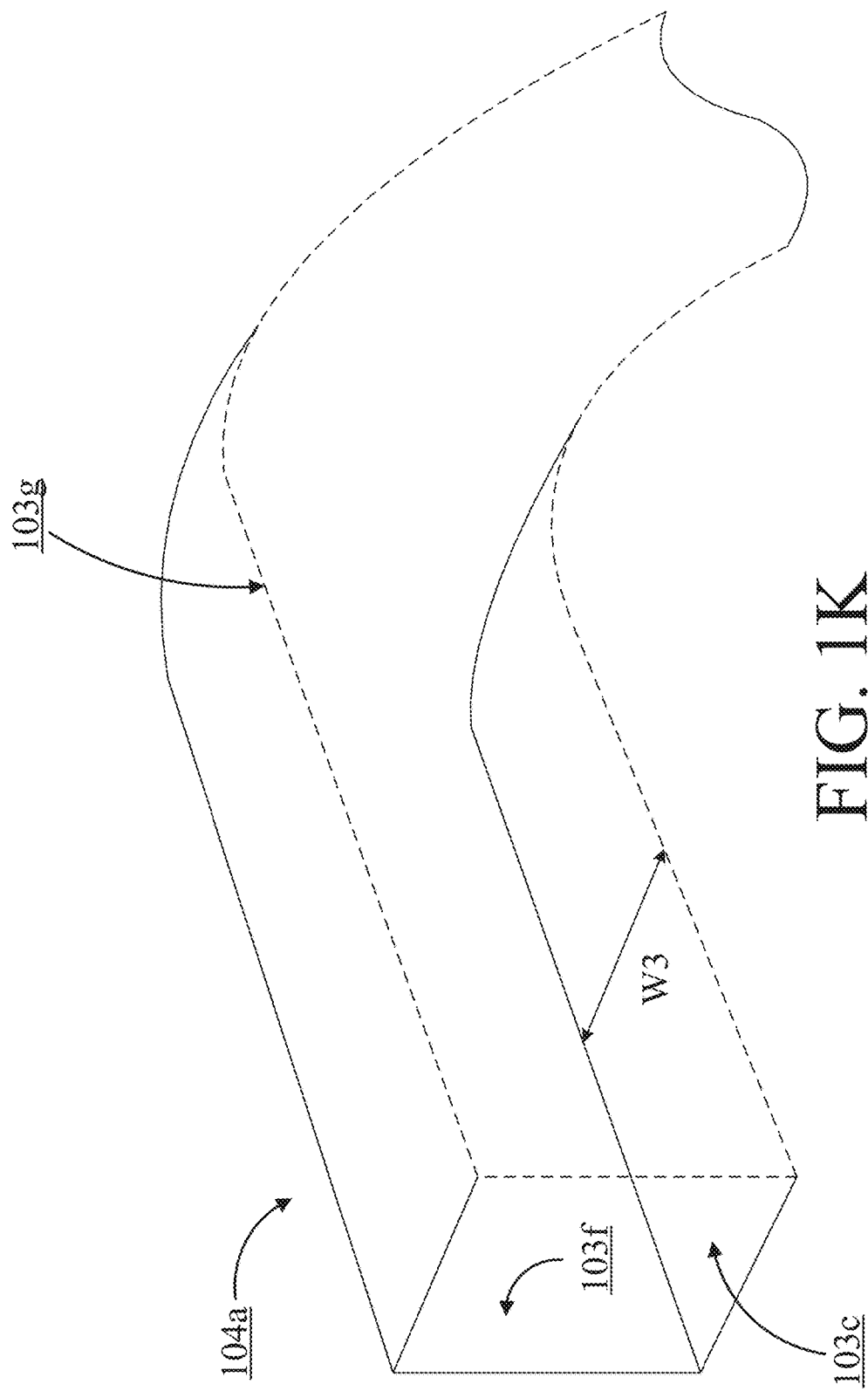
FIG. 1K is another cross-sectional view of a waveguide undergoing an exemplary plating process for modular and/or ganged waveguides used by a wave interface assembly in accordance with embodiments of the present disclosure.
Figure 1L:
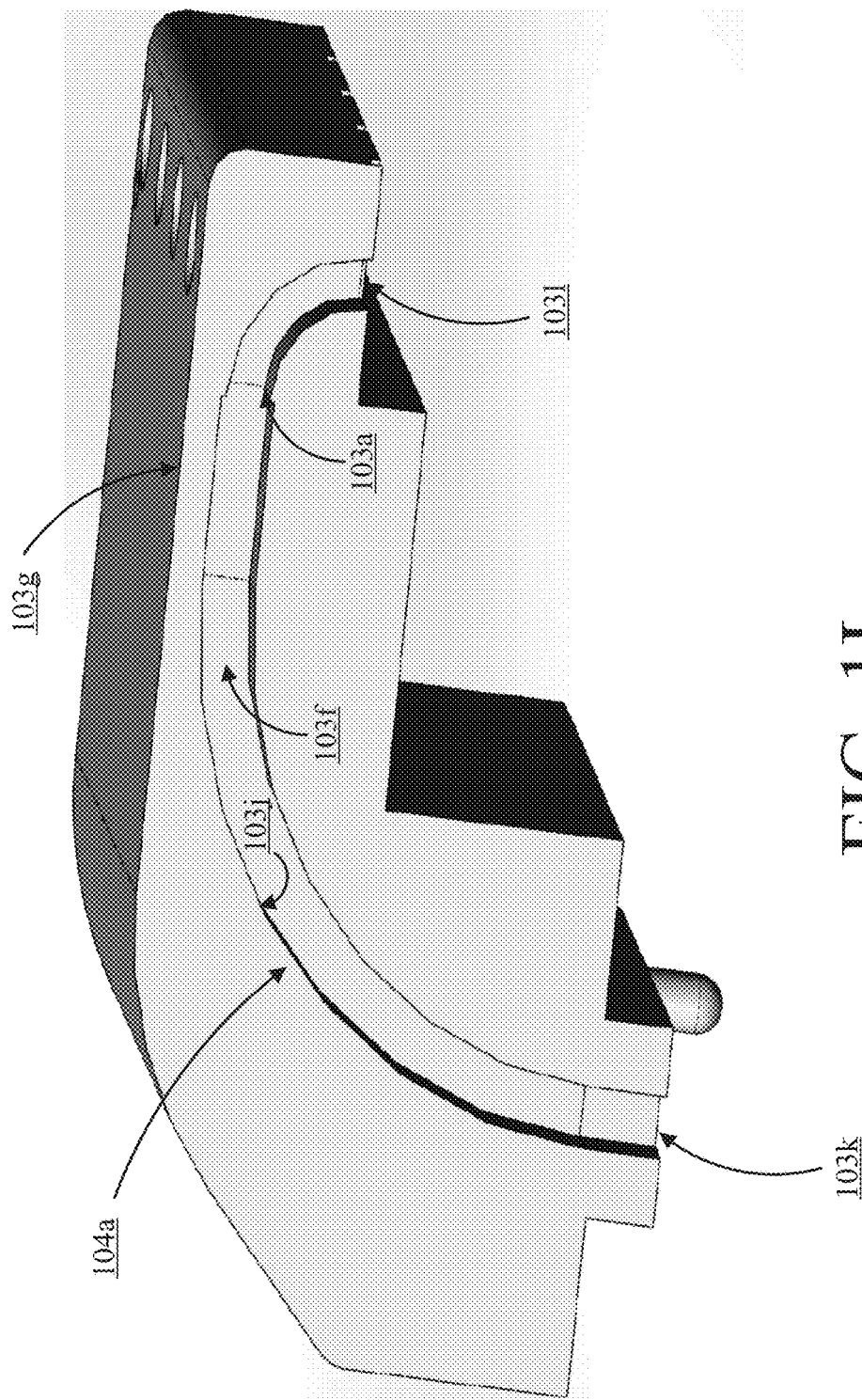
FIG. 1L is yet another cross-sectional view of a waveguide undergoing an exemplary plating process for modular and/or ganged waveguides used by a wave interface assembly in accordance with embodiments of the present disclosure.

With reference to the embodiments depicted in FIGS. 1I, 1J, 1K and/or 1L, an incision (e.g., incision 103g) can be made on a waveguide (e.g., waveguide 103-1) along its longitudinal axis such that the waveguide is divided into two portions (e.g., waveguide portions 104a and 104b). For example, with reference to the embodiments depicted in FIGS. 1I and 1J, waveguide portions 104a and 104b may share equal dimensions or may have different dimensions. By dividing the waveguide in this manner, a trench structure is formed in both waveguide portions 104a and 104b (see, e.g., trench 103c in FIG. 1K) having a respective width (e.g., width W3) that extends from the location of the incision (e.g., location of incision 103g) to an inner wall (e.g., inner wall 103f) of a waveguide portion (e.g., waveguide portion 104a, waveguide portion 104b).

In this fashion, both the outer surfaces of waveguide portions 104a and/or 104b, as well as their respective inner portions, can be exposed for plating procedures. For instance with reference to the embodiment depicted in FIG. 1L, portions of an inner surface (e.g., trench 103c, inner wall 103f, top portion 103j, etc.) within waveguide portions 104a and/or 104b can be exposed for plating procedures.

In one embodiment, plating procedures may include applying a single layer of material capable of minimizing signal degradation (e.g., silver, copper, etc.) to the inner portions and/or outer portions of the waveguide. In one embodiment, plating procedures may include applying multiple layers of material capable of minimizing signal degradation to the inner portions and/or outer portions of the waveguide. The layers may be of the same material or may be different. In one embodiment, the same layer of material may be applied to trench structures, inner walls and/or top portions within the inner surfaces of waveguide portion 104a and/or waveguide portion 104b. In one embodiment, separate layers of material may be applied individually to trench structures, inner walls and/or top portions within the inner surfaces of waveguide portion 104a and/or waveguide portion 104b.

Thus, the respective inner surfaces of a waveguide can be reinforced or plated to a higher degree than conventional methods of plating waveguides. Upon completion of plating procedures, the separate parts of the waveguide may then be secured back together (e.g., mechanically or through automation) to restore the original waveguide structure. In one embodiment, fastening agents (e.g., screws) can be used to secure waveguide portions 104a and 104b together to a sufficient degree so that signal traversal through the waveguide can occur more efficiently. In this fashion, multiple portions can be cut and then subsequently secured back together for use as "building blocks" to create modular solutions that yield a number of different customizable waveguide structures.

According to one embodiment, waveguide portions can be fabricated to include mounting elements to mount a waveguide portion to a PCB and/or patch antenna. In one embodiment, incisions can be made near the ends of a waveguide along its longitudinal axis such that waveguide covers can be produced. Furthermore, waveguide incision procedures can be performed mechanically or through automation. For instance, in one embodiment, computer-implemented procedures can be performed to create incisions while the waveguides are fabricated using 3D printer technology.

By performing incisions along the longitudinal axis, the waveguide can be divided along the direction of its electromagnetic field. Thus, plating waveguides in the manner described herein does not significantly reduce waveguide functionality and/or facilitate signal degradation. In this fashion, embodiments of the present disclosure allow for less expensive and more customizable waveguide plating procedures.

Figure 2A:
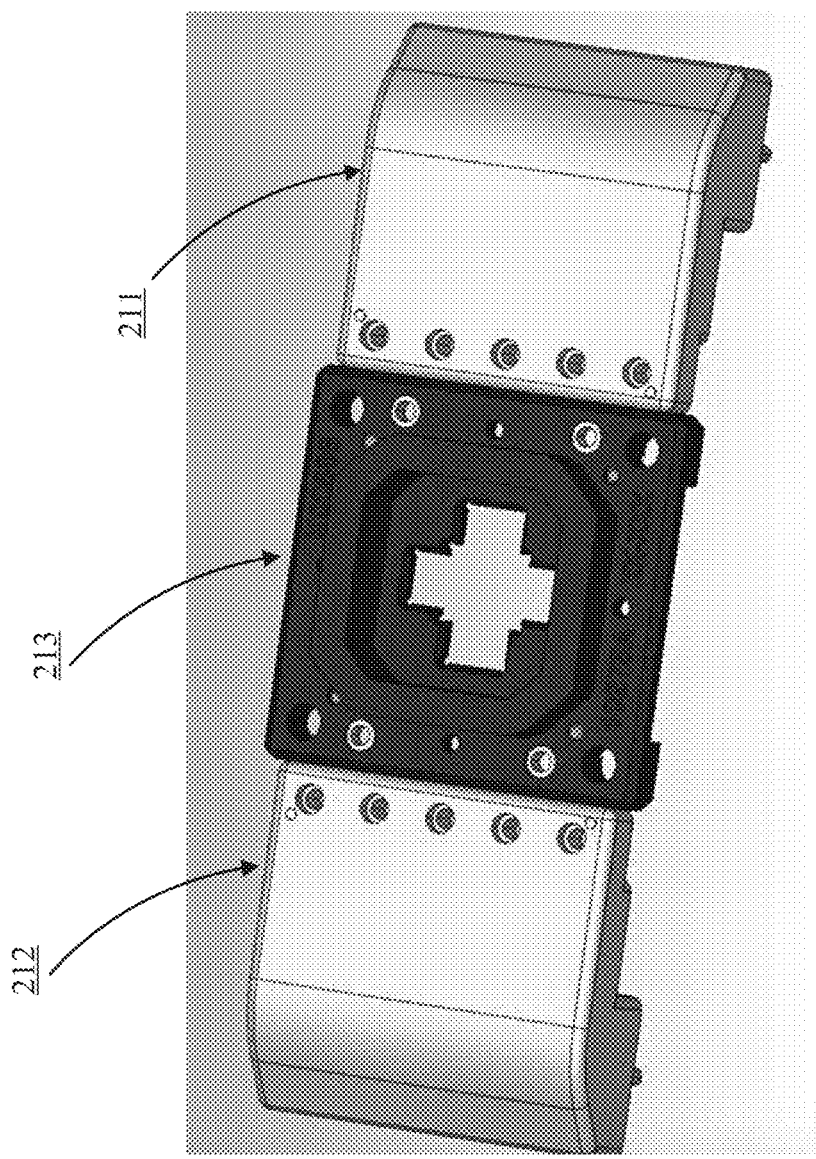
FIG. 2A is a top-side perspective view depicting a socket and two modular waveguides adjacent to either side of the socket in accordance with embodiments of the disclosure.

FIG. 2A is a top-side perspective view depicting a socket and two modular waveguides adjacent to either side of the socket in accordance with embodiments of the disclosure. As discussed above, the modular waveguides are connected to the underlying PCB using a single flange, e.g., flange 111 (not shown). In one embodiment, such as the one shown in FIG. 2A, the two modular waveguides, 211 and 212, adjacent to either side of the socket and the socket 213 itself can all be discrete components. Because they are all discrete components and additional components are needed to interconnect them, e.g., the single flange, the signal to and from the DUT has to traverse longer microstrip traces from the patch antennas in the rectangular waveguide ports to the device pads in the sockets (as will further be shown in FIG. 2B). Accordingly, the microstrip transmission lines (e.g., line 102a in FIGS. 1F and 1H) need to be longer, thereby, adding to the signal loss at the higher frequencies.

Figure 2B:
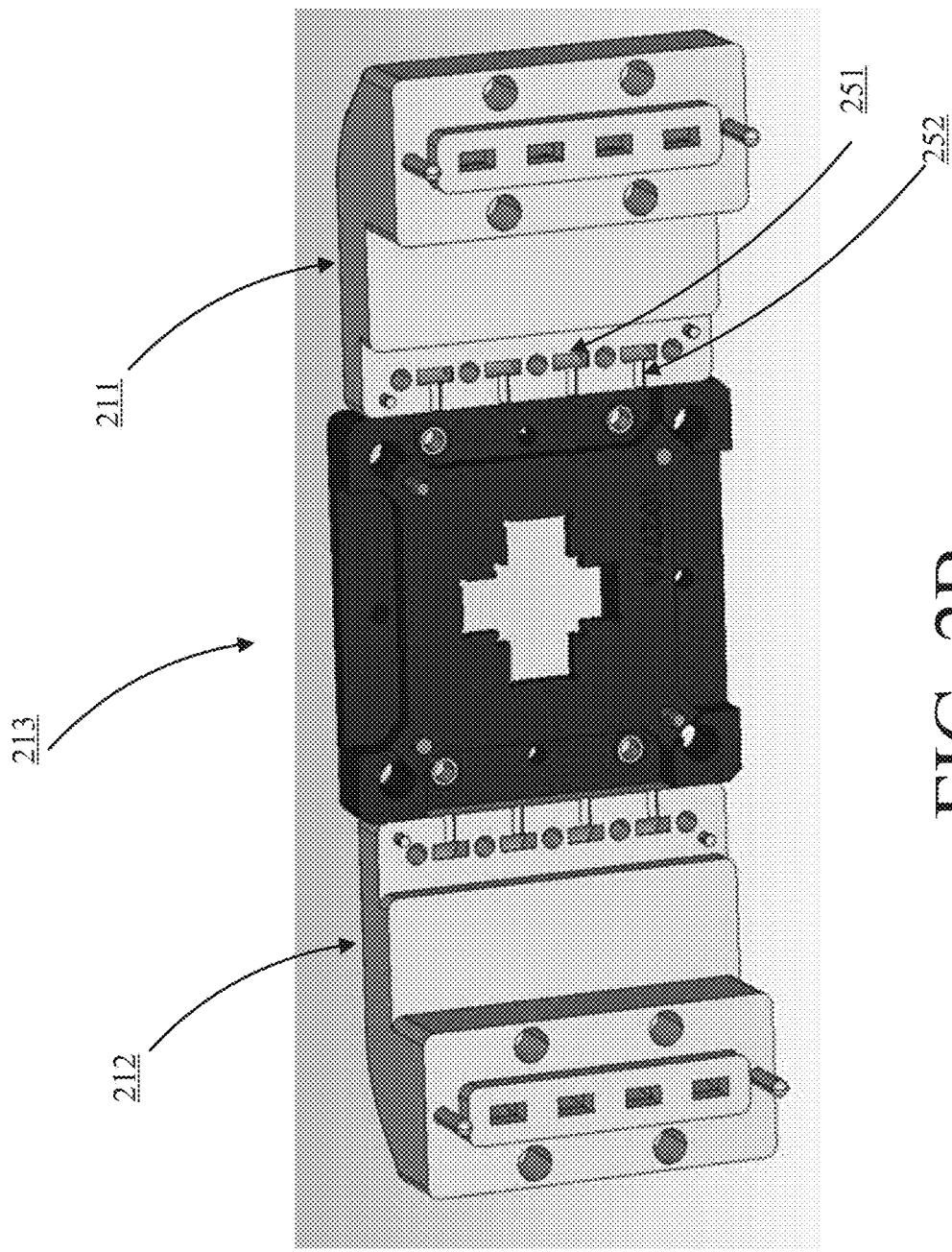
FIG. 2B is a bottom-side perspective view depicting a socket and two modular waveguides adjacent to either side of the socket in accordance with embodiments of the disclosure.

FIG. 2B is a bottom-side perspective view depicting a socket and two modular waveguides adjacent to either side of the socket in accordance with embodiments of the disclosure. As shown in FIG. 2B, when the socket and modular waveguides are separate structures, the rectangular waveguide ports (coupled to respective patch antennas), e.g., port 251 are located outside of the socket 213 area. This, therefore, results in long microstrip traces, e.g., trace 252 from the patch antennas corresponding to the rectangular waveguide ports to the device pads in the socket, as mentioned above. And, also as indicated above, this causes high path loss especially at the higher microwave frequencies.

Figure 2C:
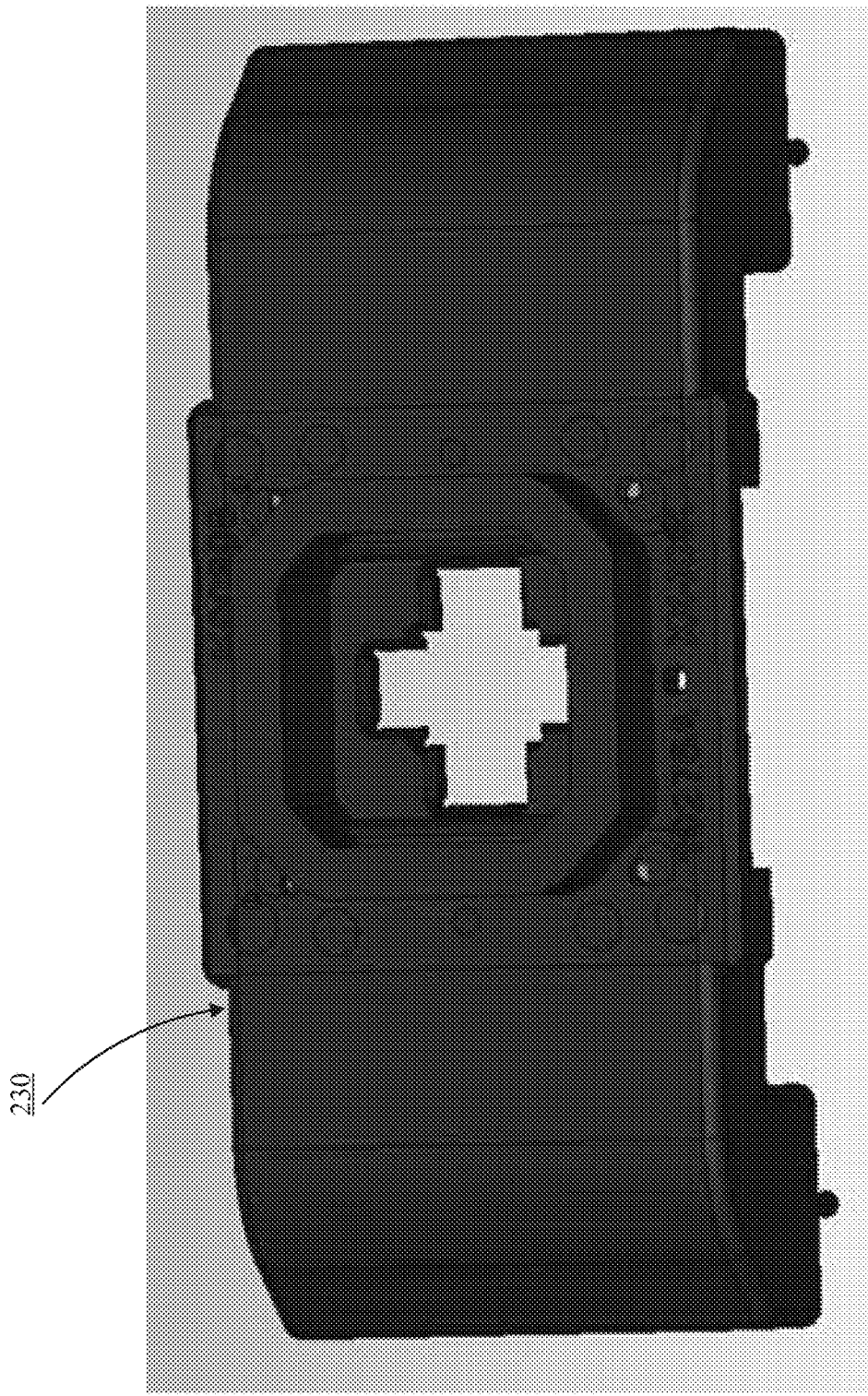
FIG. 2C illustrates a top-side perspective view of an integrated socket and waveguide structure for millimeter waveband testing in accordance with an embodiment of the present invention.
Figure 2D:
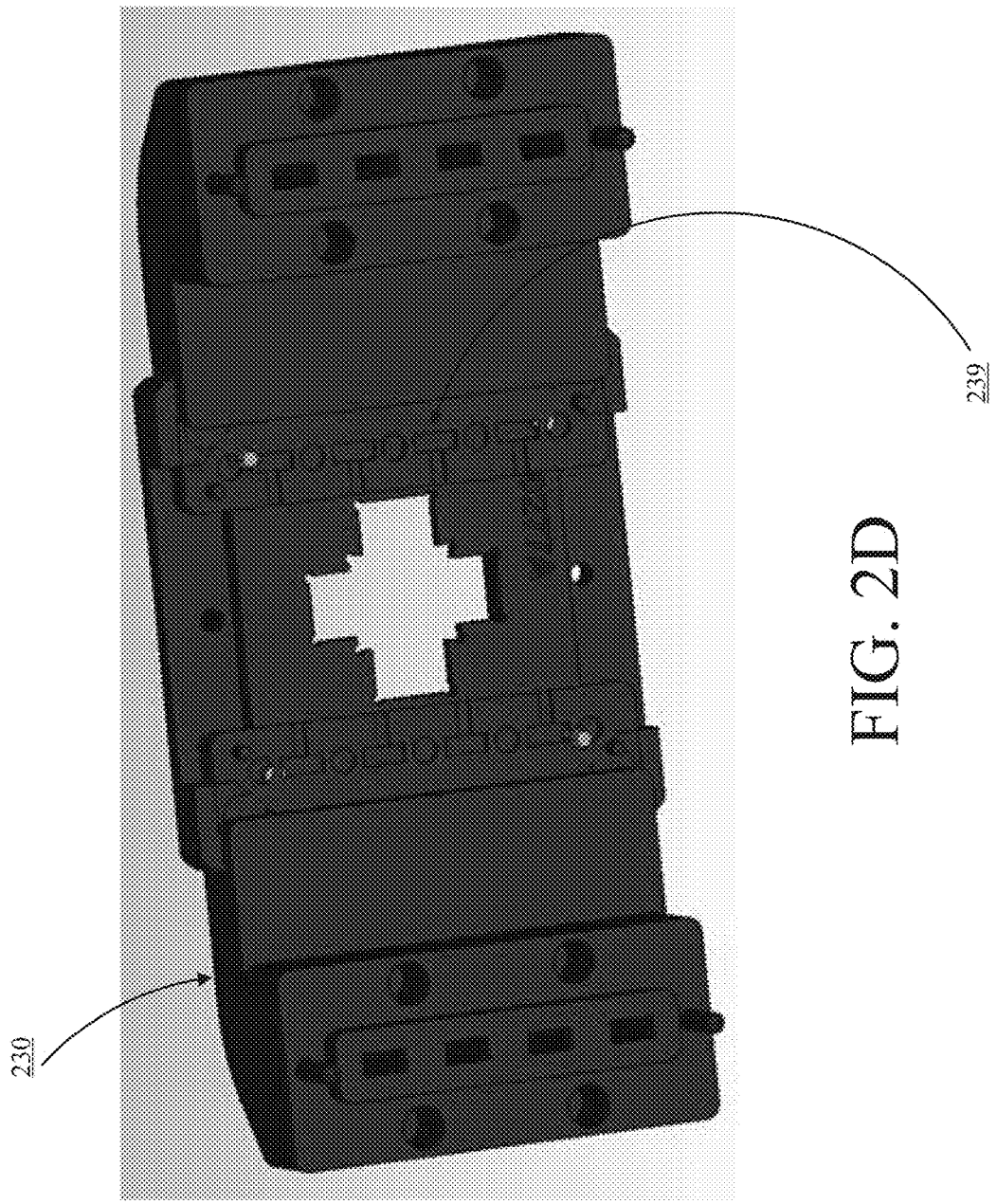
FIG. 2D illustrates a bottom-side perspective view of an integrated socket and waveguide structure for millimeter waveband testing in accordance with an embodiment of the present invention.

FIG. 2C illustrates a top-side perspective view of an integrated socket and waveguide structure for millimeter waveband testing in accordance with an embodiment of the present invention. FIG. 2D illustrates a bottom-side perspective view of an integrated socket and waveguide structure for millimeter waveband testing in accordance with an embodiment of the present invention. By integrating the socket 213 and modular waveguides 212 and 211 into a single structure 230, the rectangular waveguide ports, e.g., port 239 can be moved closer to the DUT placed into the socket (not shown), thereby, reducing path loss by reducing the length of the necessary microstrip transmission lines to the device pads. In other words, because there is no longer a boundary between the socket and the modular waveguides, and because the integrated design eliminates intermediate mounting and interconnecting components used for connecting the discrete parts, e.g., flange 111, the waveguide ports (and the corresponding patch antennas) can be positioned closer to the DUT pads. This reduces the signal path distance between the DUT port and the tester, which in turn advantageously results in increased signal strength and integrity especially at the microwave frequencies. Every centimeter of additional microstrip transmission line reduces the signal strength by a dB at the higher microwave frequencies, therefore, moving the waveguide ports (and patch antennas) closer to the DUT pads has the benefit of preserving signal strength and integrity. In one embodiment, the integrated structure shown in FIGS. 2C and 2D can be manufactured using 3D printer technology.

Figure 3A:
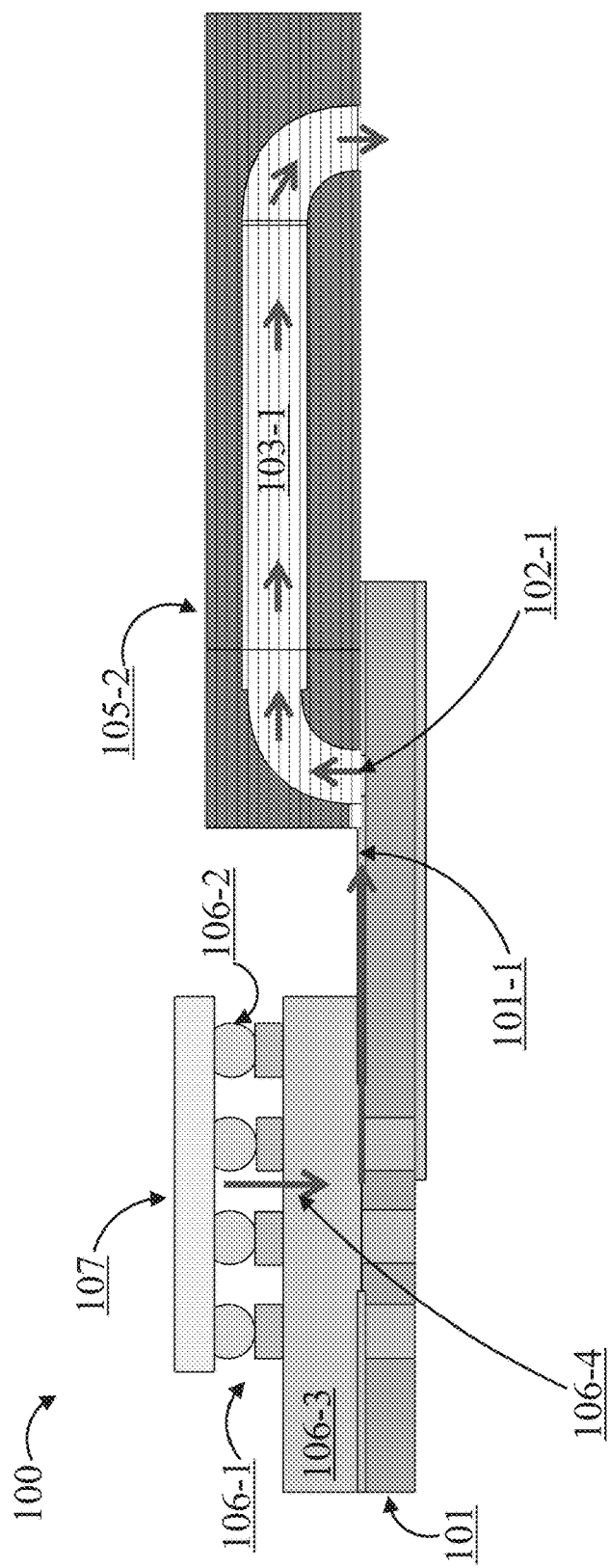
FIG. 3A depicts an exemplary signal path through an exemplary wave interface assembly in accordance with embodiments of the present disclosure.
Figure 3B:
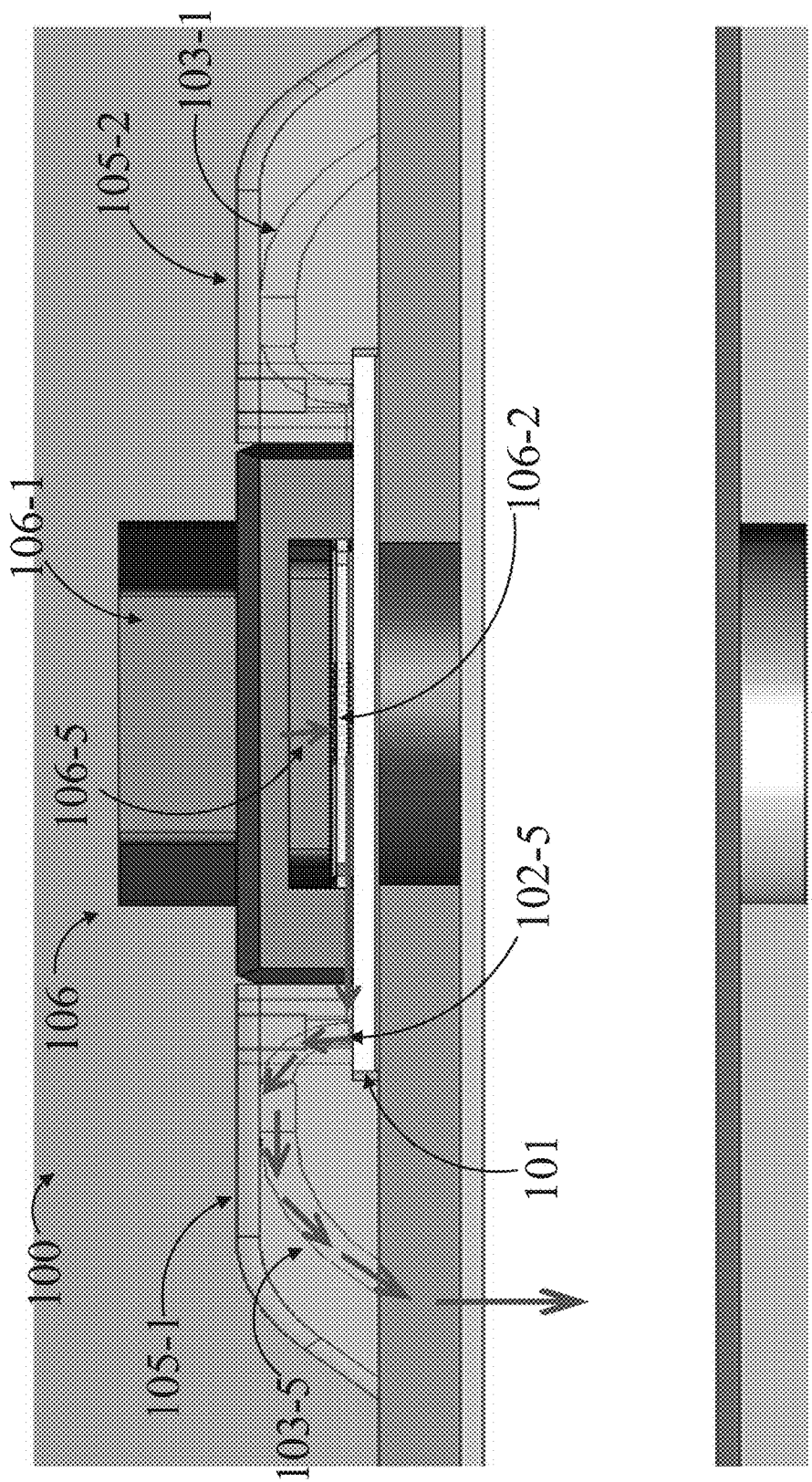
FIG. 3B depicts an exemplary signal path through an exemplary wave interface assembly in accordance with embodiments of the present disclosure.

FIGS. 3A and 3B depict exemplary signal paths through an exemplary wave interface assembly in accordance with embodiments of the present disclosure. With reference to the embodiment depicted in FIG. 3A, during a testing session using wave interface assembly 100, a device under test (e.g., DUT 107) may be loaded within a socket (e.g., socket 106-1) of a DUT interface that includes a BGA layer, such as BGA layer 106-2. As depicted in FIG. 2A, in some embodiments, wave interface assembly 100 may include a contactor layer, such has contactor layer 106-3.

Thus, when DUT 107 is loaded within socket 106-1 during the testing session, the DUT 107 can make contact with BGA layer 106-2 thereby generating test signals 106-4. A microstrip transmission line, such as microstrip transmission line 101-1, may be longitudinally formed along a top surface of PCB 101. As depicted in FIG. 2A, a patch antenna, such as patch antenna 102-1, can serve as a location where a waveguide (e.g., waveguide 103-1) is mounted onto a patch antenna (e.g., patch antenna 102-1) positioned flushed against the top surface of PCB 101 and electrically coupled to microstrip transmission line 101-1.

In this fashion, a mating interface (e.g., mating interface frame 103b of FIG. 1G and/or FIG. 1H) located at one end of wave guide 103-1 can be mounted on to a top surface of PCB 101 at a location that is perpendicular to the location of patch antenna 102-1. As depicted by the embodiment in FIG. 3A, patch antenna 102-1 can direct the propagation of test signals 106-4 received into and through an opening located at one end of waveguide 103-1. As such, patch antenna 102-1 can be configured to match impedance levels between waveguide 103-1 and microstrip transmission line 101-1 during the transmission of test signals 106-4 through wave interface assembly 100.

With reference to the embodiment depicted in FIG. 3B, wave interface assembly 100 may include waveguides placed on opposite sides of a socket 106-1 within DUT interface 106 (e.g., waveguide 103-1 and waveguide 103-5). As such, one end of wave guide 103-5 can be mounted on to a top surface of PCB 101 at a location that is perpendicular to the location of a separate patch antenna, such as patch antenna 102-5. Accordingly, patch antenna 102-5 can direct the propagation of test signals 106-5 received into and through an opening located at one end of waveguide 103-5 for further processing. In this fashion, wave interface assembly 100 includes the functionality to use different waveguide systems to transmit different sets of signals for processing.

Furthermore, as illustrated by the embodiments depicted in FIGS. 3A and 3B, wave interface assembly 100 can reduce wave signal path loss through use of waveguides while minimizing micro strip dimensions (e.g., height, width, dielectric constant values). According to one embodiment, an opposite end of a waveguide, such as waveguides 103-1 and 103-5, can be coupled to a tester diagnostic system. According to one embodiment, an opposite end of a waveguide can be coupled to a docking and/or blind mate system. Furthermore, as depicted in FIG. 3B, wave interface assembly 100 may include a cover, such as covering structure 105-1, which can encapsulate integrated waveguides, such as waveguide 103-5.

In one embodiment, if the socket 106-1 and the waveguide structure comprising waveguide 103-1, for example, are integrated into a single structure (as discussed in relation to FIGS. 2C and 2D), then the microstrip transmission line 101-1 can be shortened, thereby, reducing signal loss.

Figure 4:
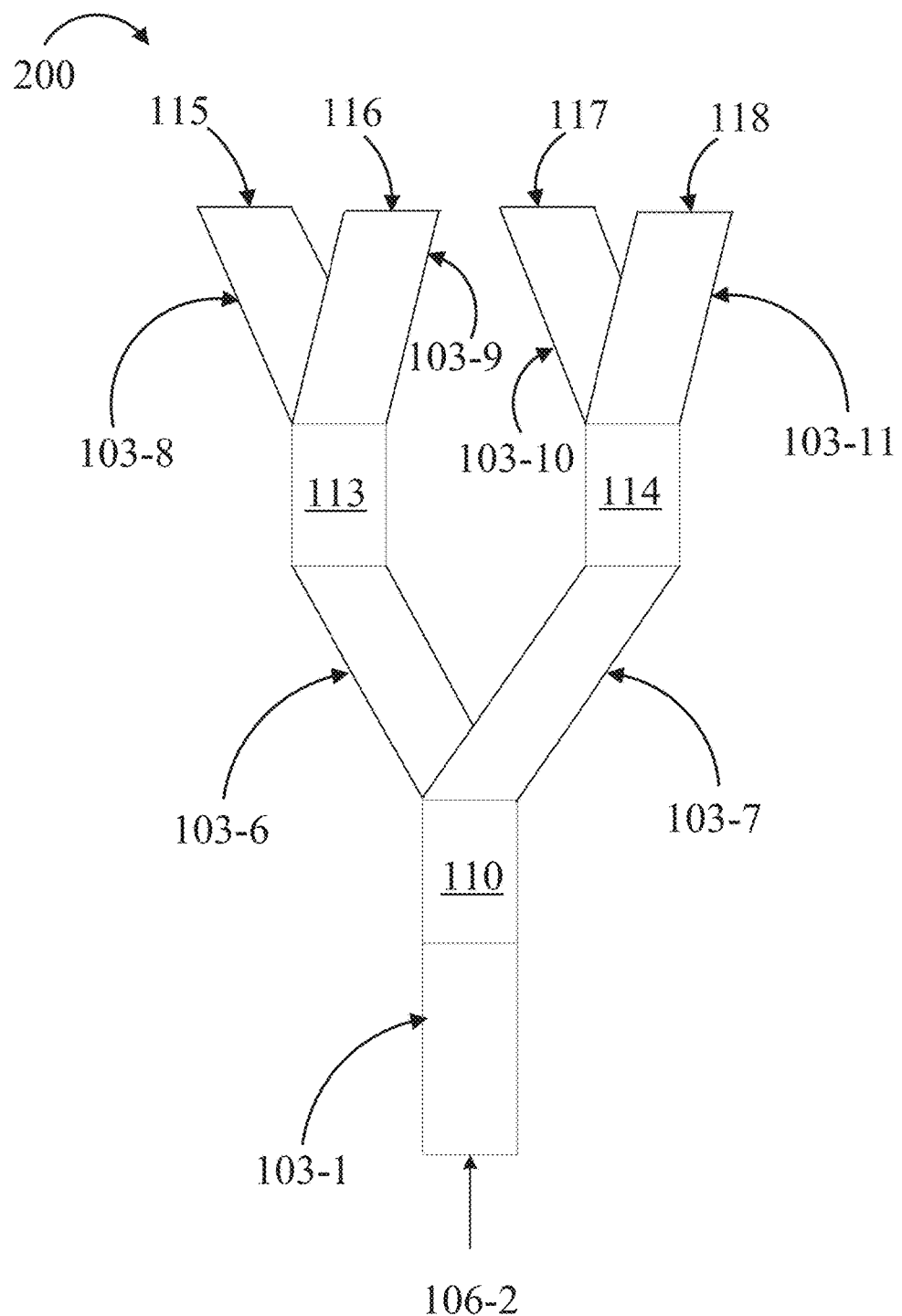
FIG. 4 depicts an exemplary waveguide component integration scheme using a wave interface assembly in accordance with embodiments of the present disclosure.

FIG. 4 depicts an exemplary cross-section of waveguide component integration using a wave interface assembly in accordance with embodiments of the present disclosure. Integrated wave interface assembly 200 may include the same or similar objects and/or components described with respect to other wave interface assemblies described herein (e.g., wave interface assembly 100) in accordance with embodiments of the present disclosure. Integrated wave interface assembly 200 may include electrical components such as power splitters, directional couplers, terminations, eccosorb wedge and/or similar components. As illustrated in FIG. 4, a signal (e.g., test signals 106-2) may enter through a waveguide, (e.g., waveguide 103-1) installed within wave interface assembly 200. As the signal travels through waveguide 103-1, it may enter a power splitter (e.g., magic tee element 110) which can be used to divide the signal into 2 portions in which each portion of the signal can travel through separate, customizable waveguides, such as waveguides 103-6 and 103-7.

Furthermore, as illustrated in FIG. 4, portions of the signal traveling through waveguides 103-6 and 103-7 can be further divided using additional power splitters (e.g., magic tee elements 113 and 114), thereby dividing the signal into additional portions (e.g., 4 portions). These portions of the signal may also traverse additional separate, customizable waveguides, such as waveguides 103-8, 103-9, 103-10 and 103-11. Moreover, as depicted in FIG. 4, waveguides (e.g., waveguides 103-8, 103-9, 103-10, 103-11) can include port openings at one end (e.g., port openings 115, 116, 117, 118). Thus, port openings 115, 116, 117, and 118 may be positioned in tighter pitch configurations which can correspondingly allow for higher density port spacing at the PCB level.

According to one embodiment, port openings 115, 116, 117, and/or 118 can be configured as phase matched ports to a PCB (e.g., PCB 101). According to one embodiment, port openings 115, 116, 117, and/or 118 can be configured as phase matched ports to a base plate. In this fashion, port openings 115, 116, 117, and/or 118 may be adapted to include additional mounting holes.

As such, these port openings allow waveguides 103-8, 103-9, 103-10 and/or 103-11 to be used as separate, independent transmit channels that are each capable of providing separate tester resources to a DUT during a testing session. According to one embodiment, these channels can be used to propagate and/or amplify test signals (e.g., test signals 106-2) transmitted between a DUT installed within socket 106-1 and a tester diagnostic system (not pictured).

According to one embodiment, magic tee elements 110, 113 and/or 114 may include terminated ports. In one embodiment, terminated ports can be terminated through the use of termination wedges. Furthermore, according to one embodiment, wave interface assembly 200 can be enclosed or encased within a structure comprising material (e.g., plastic, metal, etc.) suitable for propagating signals through waveguide systems described herein.

FIG. 5 is a flowchart of an exemplary assembly of a wave interface for testing a device in accordance with embodiments of the present disclosure. The disclosure, however, is not limited to the description provided by flowchart 300. Rather, it will be apparent to persons skilled in the relevant art(s) from the teachings provided herein that other functional flows are within the scope and spirit of the present disclosure. Flowchart 300 will be described with continued reference to exemplary embodiments described above, though the method is not limited to those embodiments.

At step 301, a plurality of patch antennas are electrically coupled to a socket of a DUT interface to store a device for testing. Each patch antenna is proximately positioned relative to each other and the socket.

At step 302, a plurality of waveguides are mounted on to a respective patch antenna from the plurality of patch antennas. Each waveguide is adapted to allow signal traversal from the device under test to a tester diagnostic system.

At step 303, test signals are generated for the device under test by a tester diagnostic system. The test signals can traverse a signal path that includes the socket, at least one patch antenna of the plurality of patch antennas, and at least one waveguide of the plurality of waveguides. In one embodiment, the plurality of waveguides are all part of a single modular or ganged waveguide structure. Further, in one embodiment, the socket and the ganged waveguide structures on each side adjacent to the socket are all part of a single integrated structure.

At step 304, upon traversal of the signal path, the test signals are received by a tester diagnostic system, where they can be further processed.

FIG. 6 is a flowchart of an exemplary method of plating a waveguide structure in accordance with embodiments of the present disclosure. The disclosure, however, is not limited to the description provided by flowchart 400. Rather, it will be apparent to persons skilled in the relevant art(s) from the teachings provided herein that other functional flows are within the scope and spirit of the present disclosure. Flowchart 400 will be described with continued reference to exemplary embodiments described above, though the method is not limited to those embodiments.

At step 401, an incision is made along an outer portion of a waveguide. The incision can be made down the middle of a waveguide along its longitudinal axis thereby dividing the waveguide into two portions and exposing both the outer and inner surfaces of each portion of the divided waveguide. The incision created during step 401 forms a respective trench in each divided portion of the waveguide. Each trench includes a width that extends from a location of the incision to an inner wall a waveguide portion.

At step 402, the inner surfaces of each portion of the divided waveguide are plated. Plating procedures include applying a layer of material on top of the trenches, the inner wall, and a top portion within the waveguide. The applied material is capable of minimizing signal degradation to the inner portions of the waveguide.

At step 403, the divided portions of the waveguide are secured together to restore the waveguide to its original structure prior to the incision procedure performed during step 401.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware configurations. In addition, any disclosure of components contained within other components should be considered as examples because many other architectures can be implemented to achieve the same functionality.

The process parameters and sequence of steps described and/or illustrated herein are given by way of example only. For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

It should also be understood, of course, that the foregoing relates to exemplary embodiments of the invention and that modifications may be made without departing from the spirit and scope of the invention as set forth in the following claims.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

Embodiments according to the invention are thus described. While the present disclosure has been described in particular embodiments, it should be appreciated that the invention should not be construed as limited by such embodiments, but rather construed according to the below claims.

What is claimed is:

1. A structure for signal transmission, said structure comprising:
   a first plurality of waveguides disposed adjacently and substantially in parallel with each other—and wherein the first plurality of waveguides is disposed adjacent to a socket; and
   the socket comprising an opening operable to support an insertion of a device under test (DUT), wherein the DUT is communicatively coupled to a plurality of microstrip transmission lines on a printed circuit board (PCB) underlying the socket for transmitting test signals from the DUT, wherein each of the microstrip transmission lines is electrically coupled to a respective patch antenna, and wherein each of the first plurality of waveguides is mounted onto a respective patch antenna, and
   wherein the first plurality of waveguides and the socket are integrated together as a common structure.

2. The structure of claim 1, wherein each of said waveguides comprises a first end and a second end, wherein each first end is mounted to a respective patch antenna, wherein each patch antenna is positioned flush against a top surface of the PCB, and further comprising:
   a second plurality of waveguides tightly disposed together and disposed substantially in parallel with each other, wherein the second plurality of waveguides is disposed adjacent to the socket on a side opposite from the first plurality of waveguides, and wherein the first plurality of waveguides, the socket and the second plurality of waveguides are integrated together as a common structure.

3. The structure of claim 2, wherein first plurality of waveguides, the socket and the second plurality of waveguides are integrated as a single plastic structure.

4. The structure of claim 2, wherein first plurality of waveguides, the socket and the second plurality of waveguides are integrated as a single metal structure.

5. The structure of claim 2, wherein the first plurality of waveguides and the second plurality of waveguides each comprise a covering structure for encapsulating a respective plurality of waveguides.

6. The structure of claim 2, wherein the second end of each waveguide is operable to be coupled to a tester diagnostic system and communicate signals to and from the DUT to the tester diagnostic system.

7. The structure of claim 6, wherein the second end of each waveguide is operable to be coupled to the tester diagnostic system using a blind mate connection.

8. The structure of claim 1, wherein the common structure comprising the socket and the first plurality of waveguides are fastened to the PCB using a fastening agent.

9. The structure of claim 1, wherein the DUT is communicatively coupled to the plurality of microstrip transmission lines on the printed circuit board (PCB) using a ball grid array.

10. A structure for signal transmission, said structure comprising:
    a first plurality of waveguides adjacently disposed and disposed substantially in parallel with each other, and wherein the first plurality of waveguides is disposed adjacent to a first side of a socket;
    a second plurality of waveguides disposed adjacently and substantially in parallel with each other, wherein the second plurality of waveguides is disposed adjacent to a second side of the socket opposite from the first plurality of waveguides; and
    the socket comprising an opening operable to support an insertion of a device under test (DUT), wherein the DUT is communicatively coupled to a plurality of microstrip transmission lines on a printed circuit board (PCB) underlying the socket for transmitting test signals from the DUT,
    wherein the first plurality of waveguides, the second plurality of waveguides and the socket are integrated together as a single structure.

11. The structure of claim 10, wherein first plurality of waveguides, the socket and the second plurality of waveguides are integrated within a single plastic structure.

12. The structure of claim 11, further comprising a plurality of channels inside the first plurality of waveguides and inside the second plurality of waveguides, said channels are metal-plated.

13. The structure of claim 10, wherein first plurality of waveguides, the socket and the second plurality of waveguides are integrated within a single metal structure.

14. The structure of claim 10, wherein the first plurality of waveguides and the second plurality of waveguides each comprise a covering structure for encapsulating a respective plurality of waveguides, wherein each plurality of waveguides and a corresponding covering structure comprise an integrated waveguide structure.

15. The structure of claim 10, wherein each of said waveguides comprises a first end and a second end, wherein each first end is operable to align with a respective patch antenna, wherein each of the microstrip transmission lines is electrically coupled to a respective patch antenna, and wherein each of the first plurality of waveguides and each of the second plurality of waveguides is mounted to a respective patch antenna positioned flush against the top surface of the PCB, and wherein the second end of each waveguide is operable to be coupled to a tester diagnostic system and communicate signals to and from the DUT to the tester diagnostic system.

16. The structure of claim 15, wherein the second opening of each waveguide is operable to be coupled to the tester diagnostic system using a docking system.

17. The structure of claim 15, wherein the single structure comprising the socket, the first plurality of waveguides and the second plurality of waveguides is configured to minimize a length of the microstrip transmission lines from device pads on the DUT to respective patch antennas.

18. The structure of claim 10, wherein the single structure comprising the socket, the first plurality of waveguides, and the second plurality of waveguides are fastened to the PCB using a fastening agent.

19. The structure of claim 10, wherein the DUT is communicatively coupled to the plurality of microstrip transmission lines on the printed circuit board (PCB) using a ball grid array.

20. A structure for signal transmission, said structure comprising:
- a first plurality of waveguides tightly disposed together and disposed substantially in parallel with each other, and wherein the first plurality of waveguides is disposed adjacent to a first side of a socket;
- a second plurality of waveguides tightly disposed together and disposed substantially in parallel with each other, wherein the second plurality of waveguides is disposed adjacent to a second side of the socket; and
- the socket comprising an opening operable to support an insertion of a device under test (DUT), wherein the DUT is communicatively coupled to a plurality of microstrip transmission lines on a printed circuit board (PCB) underlying the socket for transmitting test signals from the DUT,
- wherein the first plurality of waveguides, the second plurality of waveguides and the socket are integrated into a single structure.

21. The structure of claim 20, wherein each of said waveguides comprises a first end and a second end, wherein each first end is mounted to a patch antenna, wherein each of the microstrip transmission lines is electrically coupled to a respective patch antenna, and wherein each of the first plurality of waveguides and each of the second plurality of waveguides can be mounted onto a respective patch antenna, wherein the single structure is configured to minimize a length of the microstrip transmission lines from the DUT to the respective patch antennas, and wherein the single structure comprising the first plurality of waveguides, the second plurality of waveguides and the socket is operable to be manufactured using 3D printing technology.

22. A structure for signal transmission, said structure comprising:
- a plurality of parallel disposed waveguides, wherein said plurality of waveguides are integrated together as a common molded structure and share a common flange on a first end and on a second end comprise openings for aligning with patch antennae; and
- a socket for receiving and aligning with a device under test (DUT), said socket being integrated with said plurality of waveguides at said second end as said common molded structure.

23. The structure as described in claim 22 further comprising:
- another plurality of parallel disposed waveguides, wherein said another plurality of waveguides are integrated together as a common molded structure and share a common flange on a first end and on a second end comprise openings for aligning with patch antennae; and
- wherein said socket being integrated with said another plurality of waveguides at said second end as said common molded structure.

24. The structure as described in claim 23, wherein the DUT is communicatively coupled to a plurality of microstrip transmission lines on a printed circuit board (PCB) underlying said socket for transmitting test signals from said DUT, wherein each of said microstrip transmission lines is electrically coupled to a respective patch antenna, and wherein each of said plurality of waveguides and each of said another plurality of waveguides can be mounted onto a respective patch antenna.

* * * * *